US010615497B2

(12) United States Patent
Watanabe et al.

(10) Patent No.: US 10,615,497 B2
(45) Date of Patent: Apr. 7, 2020

(54) SPLITTER CIRCUIT AND ANTENNA

(71) Applicant: Mitsubishi Electric Corporation, Tokyo (JP)

(72) Inventors: Hikaru Watanabe, Tokyo (JP); Takashi Maruyama, Tokyo (JP); Akimichi Hirota, Tokyo (JP); Satoshi Yamaguchi, Tokyo (JP); Masataka Otsuka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/088,625

(22) PCT Filed: Apr. 25, 2016

(86) PCT No.: PCT/JP2016/062886
§ 371 (c)(1),
(2) Date: Sep. 26, 2018

(87) PCT Pub. No.: WO2017/187473
PCT Pub. Date: Nov. 2, 2017

(65) Prior Publication Data
US 2019/0109377 A1    Apr. 11, 2019

(51) Int. Cl.
*H01Q 3/24*  (2006.01)
*H01P 5/12*  (2006.01)
(Continued)

(52) U.S. Cl.
CPC ............. *H01Q 3/24* (2013.01); *H01P 3/06* (2013.01); *H01P 3/08* (2013.01); *H01P 5/12* (2013.01);
(Continued)

(58) Field of Classification Search
CPC .. H01Q 3/24; H01Q 3/06; H01Q 3/08; H01Q 5/12; H01Q 3/30; H01Q 3/34; H01Q 7/38; H01Q 5/085
See application file for complete search history.

(56) References Cited

U.S. PATENT DOCUMENTS

| 6,323,742 B1 | 11/2001 | Ke |
| 7,675,385 B1 | 3/2010 | Mulbrook et al. |
| 2016/0365888 A1 | 12/2016 | Cagle et al. |

FOREIGN PATENT DOCUMENTS

| JP | 6-41213 U | 5/1994 |
| JP | 11-355002 A | 12/1999 |

(Continued)

OTHER PUBLICATIONS

International Search Report issued in PCT/JP2016/062886 (PCT/ISA/210), dated Jul. 19, 2016.
(Continued)

*Primary Examiner* — Graham P Smith
(74) *Attorney, Agent, or Firm* — Birch, Stewart, Kolasch & Birch, LLP

(57) ABSTRACT

An object of the present invention is to vary the directivity of an antenna (100a) while reducing the signal loss by switching circuits (5a-5d) in a splitter circuit.

The switching circuits (5a-5d) in the splitter circuit connect or disconnect n (n is an integer of 2 or more) second lines (12a) connected in parallel with a first line (10a) to/from output terminals (7) connected to n antenna elements (8) having different directivities of signals. If m (m is an integer ranging from 1 to n−1) switching circuits (5b, 5d) arbitrarily selected from the n switching circuits (5a-5d) are switched to on-states, the characteristic impedance of each of the n second lines (12a) is set to a product between the charac-
(Continued)

teristic impedance of the first line (10*a*) and the number m of switching circuits (5*b* and 5*d*) switched to on-states.

17 Claims, 9 Drawing Sheets

(51) Int. Cl.
*H01Q 3/30* (2006.01)
*H01P 3/06* (2006.01)
*H01P 3/08* (2006.01)
*H01Q 3/34* (2006.01)
*H03H 7/38* (2006.01)
*H01P 5/08* (2006.01)

(52) U.S. Cl.
CPC ............... *H01Q 3/30* (2013.01); *H01Q 3/34* (2013.01); *H03H 7/38* (2013.01); *H01P 5/085* (2013.01)

(56) References Cited

FOREIGN PATENT DOCUMENTS

| JP | 2001-345717 A | 12/2001 |
| JP | 2012-161000 A | 8/2012 |
| WO | WO 2015/163977 A1 | 10/2015 |

OTHER PUBLICATIONS

Notification of Reasons for Refusal for Japanese Application No. 2018-513948, dated Jul. 17, 2018.
Extended European Search Report issued in corresponding European Application No. 16900346.4 dated Mar. 20, 2019.
Simon R. N. et al., "Coax-to-channelised coplanar waveguide in-phase n-way, radial power divider", Electronic Letters, IEE Stevenage, GB, vol. 26, No. 11, May 24, 1990, pp. 754-756.

SPLITTER CIRCUIT AND ANTENNA

TECHNICAL FIELD

The present invention relates to a signal splitter circuit and an antenna including a signal splitter circuit.

BACKGROUND ART

A conventional antenna disclosed in Patent Literature 1 includes a splitter circuit and a pair of antenna elements spaced apart from each other in order to transmit and/or receive electric waves from all directions at high levels. The splitter circuit of the antenna in Patent Literature 1 includes input terminals that receive signals and are connected to the antenna elements via a branched line split in two segments. The antenna includes another line and a delaying circuit that are connected in parallel between one end of the branched line and the antenna element connected to the end of the branched line. The antenna also includes two switching circuits switching between the line and the delaying circuit. The switching circuits are switched to transmit, to one of the antenna elements, a signal with the same phase as or with a phase different from that of the other antenna element. The directivity is varied in such a simple configuration.

CITATION LIST

Patent Literature 1: Japanese Utility Model Application Publication No. 1994-41213.

SUMMARY OF INVENTION

Technical Problem

The conventional antenna as described above, however, requires at least two switching circuits for one antenna element to switch between the line transmitting signals to one of the antenna elements and the delaying circuit. Hence, the switching circuits have high signal loss. The splitter circuit including the switching circuits has high signal loss accordingly.

An object of the present invention, which has been made in view of the above mentioned problem, is to provide an antenna including a splitter circuit that can vary the directivities of antenna elements while reducing the signal loss in the switching circuits in the splitter circuit.

Solution to Problem

A splitter circuit according to the present invention includes: an input terminal configured to receive a signal; n output terminals connected to n respective antenna elements which have different transmission directions where n is an integer of 2 or more, and configured to output signals input from the input terminal; a first line having a first end connected to the input terminal; n second lines having respective first ends connected in parallel to a second end of the first line; and n switching circuits connected to respective second ends of the n second lines and the respective n output terminals, and configured to perform switching to connect or disconnect the second ends of the n second lines to/from the n output terminals. When m switching circuits are arbitrarily selected from among the n switching circuits and switched to on-states where m is an integer ranging from 1 to n−1, characteristic impedances of the n second lines are set to a product between a characteristic impedance of the first line and the integer m denoting the number of the switching circuits switched to on-states.

A splitter circuit according to the invention includes: an input terminal configured to receive a signal; n output terminals connected to n respective antenna elements where n is an integer of 2 or more, and configured to output signals input from the input terminal; a first line having a first end connected to the input terminal; a second line having a first end connected to a second end of the first line; a third line having a first end which is connected to the second end of the first line in parallel with the second line, and configured to transmit a signal with a delay time different from a delay time in the second line; n fourth lines having first ends connected in parallel to a second end of the second line; n fifth lines having first ends connected in parallel to a second end of the third line; and n switching circuits connected to respective second ends of the n fourth lines, respective second ends of the n fifth lines, and the respective n output terminals, and configured to perform switching to connect the n output terminals to either the second ends of the fourth lines or the second ends of the fifth lines. When m switching circuits are arbitrarily selected from among the n switching circuits and switched to connect with the second ends of the fourth lines where m is an integer ranging from 1 to n−1 while n−m switching circuits are switched to connect with the second ends of the fifth lines, characteristic impedances of the n fourth lines are set to a product between a characteristic impedance of the second line and the integer m denoting the number of the fourth lines connected to the output terminal, and characteristic impedances of the n fifth lines are set to a product between a characteristic impedance of the third line and the integer n−m denoting the number of the fifth lines connected to the output terminal.

A splitter circuit according to the invention includes: an input terminal configured to receive a signal; n first output terminals connected to respective n first antenna elements where n is an integer of 2 or more, and configured to output signals input from the input terminal; l second output terminals connected to respective l second antenna elements where l is an integer of 2 or more, and configured to output signals input from the input terminal; a first line having a first end connected to the input terminal; a second line and a third line which have first ends connected in parallel to a second end of the first line, and configured to transmit signals with different delay times, respectively; n fourth lines having respective first ends connected in parallel to a second end of the second line; l fifth lines having respective first ends connected in parallel to a second end of the third line;

n first switching circuits connected to respective second ends of the n fourth lines and the respective n first output terminals, and configured to perform switching to connect or disconnect the second ends of the n fourth lines to/from the n first output terminals; and l second switching circuits connected to respective second ends of the l fifth lines and the respective l second output terminals, and configured to perform switching to connect or disconnect the second ends of the l fifth lines to/from the l second output terminals. When m first switching circuits are arbitrarily selected from among the n first switching circuits and switched to on-states where m is an integer ranging from 1 to n−1 while x second switching circuits are arbitrarily selected from among the l second switching circuits and switched to on-states where x is an integer ranging from 1 to l−1, characteristic impedances of the n fourth lines are set to a product between a characteristic impedance of the second line and the integer m denoting the number of the first switching circuits switched to on-states, and characteristic impedances of the l fifth lines are set to a product between a characteristic impedance of the third line and the integer x denoting the number of the second switching circuits switched to on-states.

An antenna according to the invention includes the splitter circuit described in the preceding paragraphs, further including n antenna elements connected to n output terminals, respectively.

An antenna according to the invention includes the splitter circuit described in the preceding paragraph wherein n first antenna elements are connected to the n output terminals, respectively; and l second antenna elements is connected to the l second output terminals, respectively.

Advantageous Effect of Invention

In accordance with the invention, the switching circuits connect or disconnect the n second lines connected in parallel to the first line to/from the output terminals connected to the n antenna elements. When the switching circuits arbitrarily selected from among the n switching circuits are switched to on-states, the characteristic impedance of each of the n second line is set to a product between the characteristic impedance of the first line and the number of arbitrarily selected switching circuits. In such a configuration, signals can propagate from the splitter circuit while the directivities of the antenna elements can be varied and the signal loss in the switching circuits can be reduced because the number of switching circuits decreases compared to a conventional technique.

DESCRIPTION OF EMBODIMENTS

Embodiment 1

Figure 1:
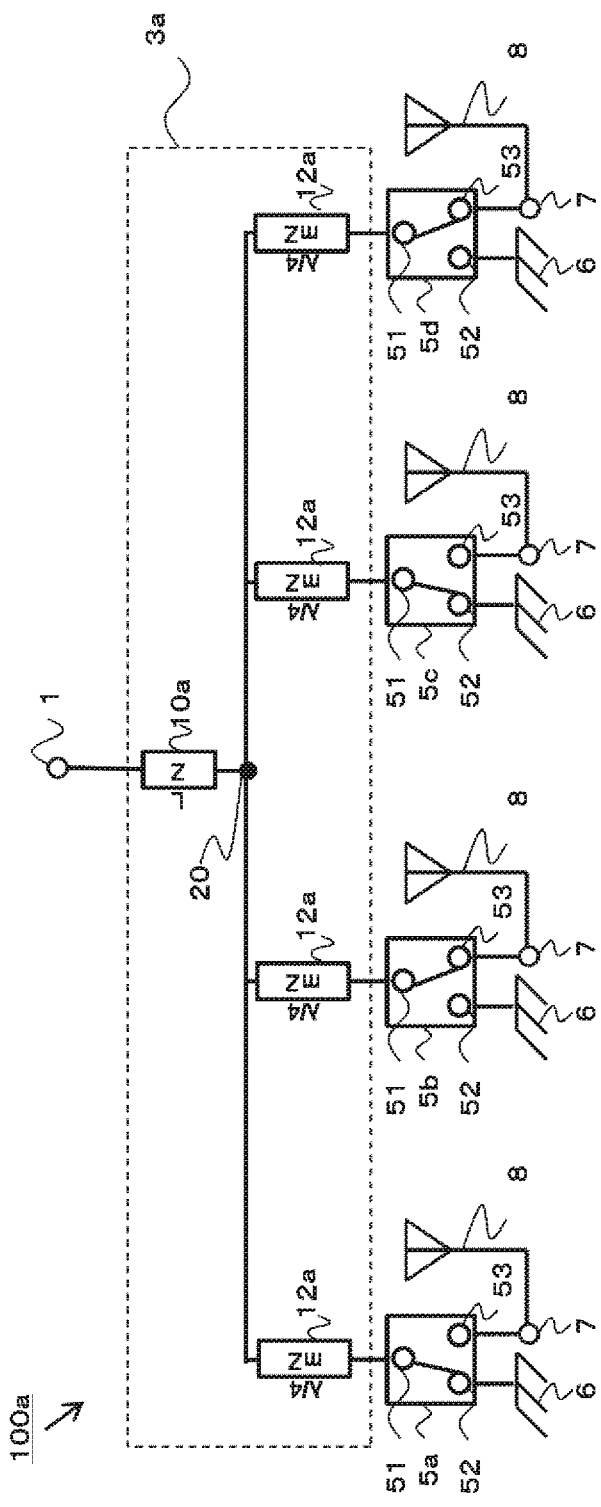
FIG. 1 illustrates a configuration of an antenna according to Embodiment 1 of the present invention.

FIG. 1 illustrates a configuration of an antenna 100a according to Embodiment 1 of the present invention.

The antenna 100a in FIG. 1 includes a splitter circuit and n antenna elements 8 connected to the splitter circuit, where n represents an integer of 2 or more. The antenna 100a including four antenna elements 8 will now be described.

The four antenna elements 8 are disposed such that they have different radiation directivities of waves. One to three of the four antenna elements 8 are selected, and the selected antenna element(s) 8 transmits signals to vary the directivity.

The splitter circuit includes an input terminal 1 receiving signals; a branch circuit module 3a connected to the input terminal 1; four switching circuits 5a-5d each having one end connected to the branch circuit module 3a; and four output terminals 7 connected to the respective switching circuits 5a-5d and the respective antenna elements 8 and outputting signals from the input terminal 1. The switching circuits 5a-5d are single-pole double-throw (SPDT) switches. It should be noted that the switching circuits 5a-5d may be mechanical switches or electronic switches.

The branch circuit module 3a includes a first line 10a having a first end connected to the input terminal 1; and four second lines 12a having first ends connected in parallel to a branch point 20 at a second end of the first line 10a and further having second ends connected to the respective switching circuits 5a-5d. Hereinafter, the characteristic impedance of the first line 10a is denoted by Z, and the length of the first line 10a is denoted by L. The first line 10a has a characteristic impedance of 50Ω. The characteristic impedance of each of the four second lines 12a is denoted by $Z_b$.

Figure 2:
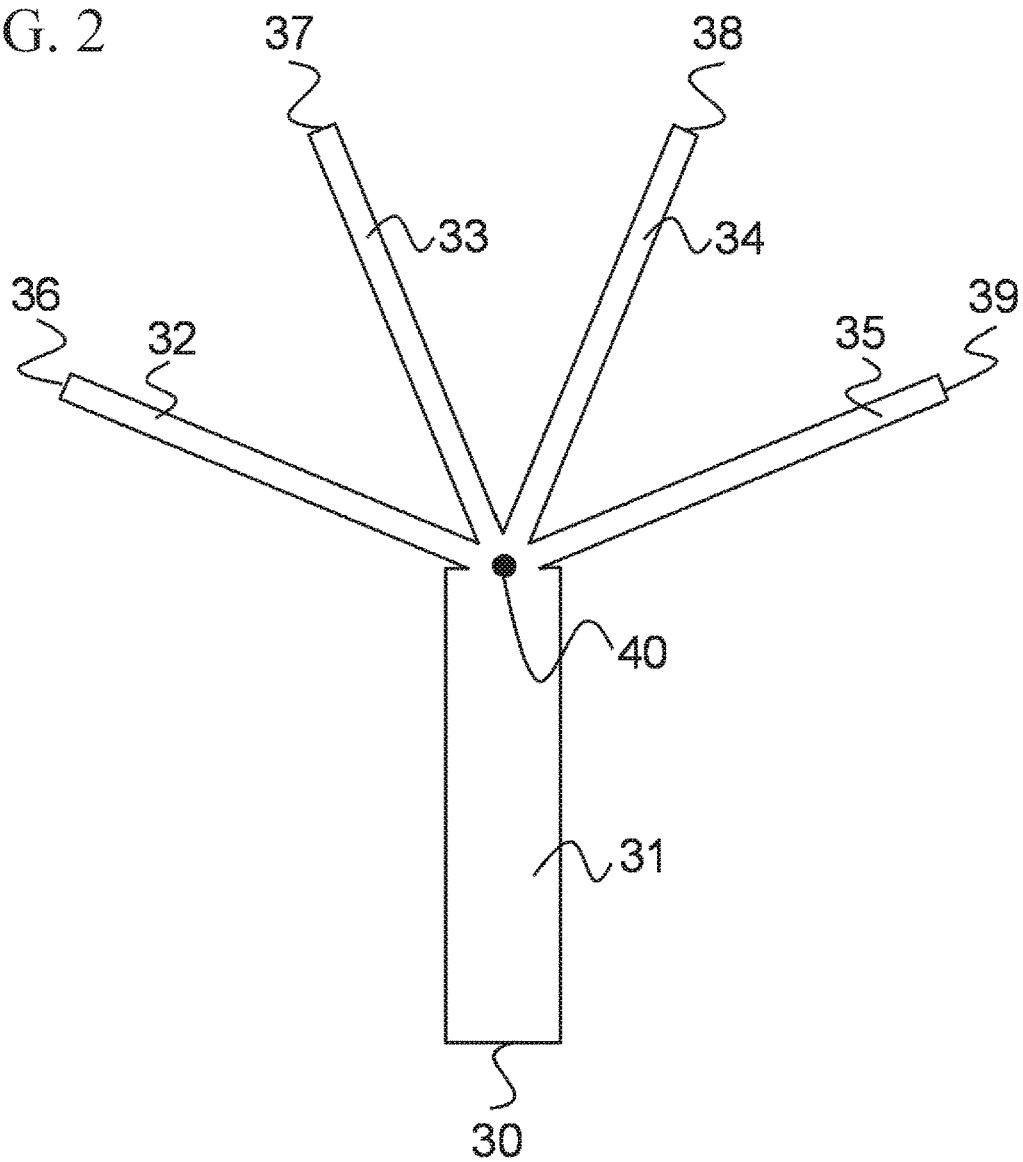
FIG. 2 is an exemplary configuration of a branch circuit module according to Embodiment 1 of the invention.

FIG. 2 is an exemplary configuration of the branch circuit module 3a in FIG. 1 including tri-plate strip lines. In the branch circuit module 3a in FIG. 2, a strip line 31 corresponds to the first line 10a; an input terminal 30 of the strip line 31 corresponds to the input terminal 1; a branch point 40 of the strip line 31 corresponds to the branch point 20 at the second end of the first line 10a; strip lines 32-35 correspond to the four second lines 12a and are branched from the branch point 40 of the strip line 31, respectively; and output terminals 36-39 of the strip lines 32-35 correspond to the ends of the four second lines 12a connected to the respective switching circuits 5a-5d. The characteristic impedance of the strip line 31 is denoted by Z, the length of the strip line 31 is denoted by L, and the characteristic impedance of each of the strip lines 32-35 is denoted by $Z_b$. The branch circuit module 3a in FIG. 1, composed of strip lines, can be readily manufactured.

Figure 3:
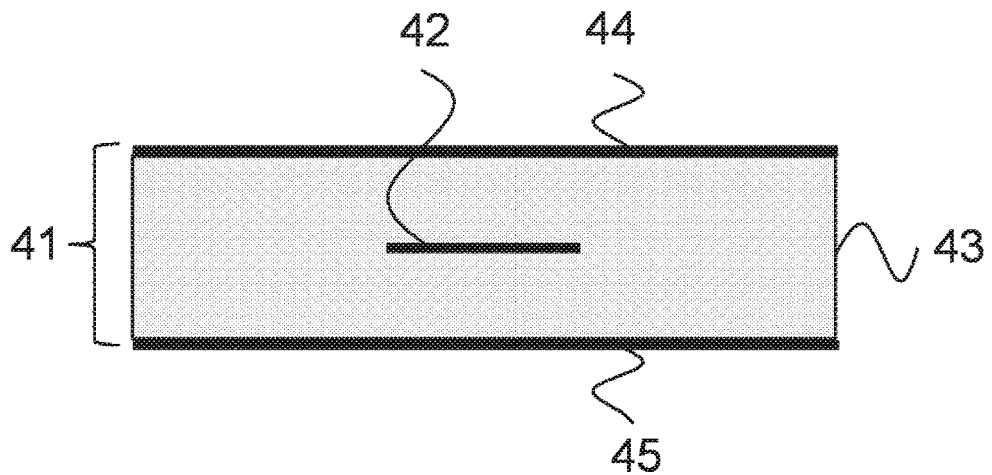
FIG. 3 is a cross-sectional view of a tri-plate strip line.

FIG. 3 is a cross-sectional view of a tri-plate strip line. Each strip line in FIG. 2 is composed, for example, of a strip line illustrated in FIG. 3. The tri-plate strip line 41 includes a strip line 42, a dielectric material 43, and base conductors 44 and 45, as illustrated in FIG. 3.

Returning to FIG. 1, the switching circuits 5a-5d have the same configuration. The switching circuits 5a-5d are disposed between the second ends of the four second lines 12a and the four output terminals 7, respectively. The switching circuits 5a-5d connect or disconnect the second ends of the four second lines 12a to/from the four output terminals 7, respectively. In detail, the switching circuits 5a-5d each include a switch terminal 51 connected to the second line 12a, a switch terminal 52 connected to a ground terminal 6, and a switch terminal 53 connected to the output terminal 7. Thereby, the switch terminal 51 is connected to the switch terminal 52, or the switch terminal 51 is connected to the switch terminal 53. The state of the switching circuits 5a-5d connecting the switch terminals 51 to the switch terminals 52 will be referred to as an off-state. The state of the switching circuit 5a-5d connecting the switch terminals 51 to the switch terminals 53 will be referred to as an on-state. The switching circuits 5a-5d respectively include control circuits that control the switching circuits 5a-5d, which are switched to on-states or off-states by the control circuits.

When any of the switching circuits 5a-5d is switched to off-states, the switch terminal 52 is connected to the ground terminal 6 and is thus short-circuited. In order to reduce impedance mismatch among the lines, each second line 12a has a length set to an odd integral multiple of ¼ of the guide-wavelength in the four second lines 12a at an operating frequency. In a case where the second line 12a has a length being an odd integral multiple of ¼ of the guide-wavelength in the four second lines 12a at the operating frequency, the switch terminal 52 of the switching circuit switched to an off-state is open at infinite impedance as seen from the branch point 20. Let the guide-wavelength in the four second lines 12a at the operating frequency be λ, then the length of each of four second lines 12a is λ/4. Also in the branch circuit module 3a in FIG. 2, the length from the branch point 40 to each of the output terminals 36-39 of the strip lines is λ/4.

The operation of the antenna 100a will now be explained.

When the input terminal 1 receives signals, the signals propagate from the input terminal 1 via the first line 10a to the branch circuit module 3a. The signals reaching the branch circuit module 3a are split in four segments at the branch point 20 in the branch circuit module 3a and propagate to the second lines 12a. The four second lines 12a transmit the signals to the switching circuits 5a-5d, respectively.

Among the switching circuits 5a-5d, m arbitrarily selected switching circuits are switched to on-states. A possible range of m will be described below. In Embodiment 1, the switching circuits 5b and 5d are switched to on-states whereas the remaining switching circuits 5a and 5c are switched to off-states.

The impedance as seen from the branch point 20 toward the output terminal 7 is hereinafter denoted by $Z_a$. The impedance matching before and after the split of signals at the branch point 20 will be discussed. The n antenna elements 8 are provided. Among n switching circuits, m switching circuits are arbitrarily switched to on-states. The characteristic impedance of the first line 10a is denoted by Z, and the characteristic impedance of each second line 12a is denoted by $Z_b$. It should be noted that the number n of antenna elements 8 is an integer of 2 or more. Among n switching circuits, m switching circuits are switched to on-states, where m is an integer ranging from 1 to n−1. In a case where n second lines 12a each have a length being an odd integral multiple of ¼ of the guide-wavelength in the n second lines 12a at the operating frequency, the terminals of n−m switching circuits switched to off-states are open at infinite impedance as seen from the branch point 20. The terminals of m switching circuits switched to on-states are connected in parallel to lines each having a characteristic impedance $Z_b$. Thus, the impedance $Z_a$ as seen from the branch point 20 toward the output terminal 7 is expressed by Expression (1):

[Expression 1]

$$Z_a = \frac{Z_b}{m} \quad (1)$$

Meanwhile, the first line 10a has a characteristic impedance Z, which is the impedance as seen from the branch point 20 toward the input terminal 1 and thus the impedance at the input terminal 1. In order to reduce the signal loss, $Z_a$ should be equal to Z for the impedance matching before and after the split of signals at the branch point 20. Thus, the impedance mismatching does not occur if the characteristic impedance $Z_b$ of each second line 12a is equal to mZ that is a product between the characteristic impedance of the first line 10a and the number m of the switching circuits switched to on-states. Arbitrary selection of the m switching circuits to be switched to on-states among the n switching circuits in the branch circuit module 3a does not cause an impedance mismatch loss; the impedance $Z_a$ as seen from the branch point 20 toward the output terminal 7 is not affected. In the following description, the characteristic impedance of the second line 12a is denoted by mZ.

The characteristic impedance of the second line 12a will now be described in detail. In Embodiment 1, four antenna elements 8 are provided. Among the four switching circuits 5a-5d, the switching circuits 5b and 5d are arbitrarily switched to on-states. The first lines 10a each have a characteristic impedance of 50Ω. The second line 12a has a length of λ/4. The switch terminal 52 of each of the switching circuits 5a and 5c switched to off-states is open at an infinite impedance as seen from the branch point 20. The switch terminals 53 of the switching circuits 5b and 5d switched to on-states are connected in parallel. The mismatch of the characteristic impedance $Z_b$ among the second lines 12a does not occur under the above conditions as long as the characteristic impedance is the product "100Ω" between the characteristic impedance "50Ω" of the first line 10a and the number "2" of switching circuits switched to on-states.

The operation of the antenna 100a will be explained again. When the switching circuits 5b and 5d are switched to on-states and the remaining switching circuits 5a and 5c are switched to off-states, the switching circuits 5a and 5c are connected to the ground terminals 6. The switching circuits 5b and 5d connected to the output terminals 7 cause signals to propagate to the output terminals 7. The signals reaching the output terminals 7 connected to the switching circuits 5b and 5d are transmitted to the antenna elements 8, which radiate the signals. The antenna elements 8 have different radiation directivities of waves and thus vary the directivities of the signals transmitted from the selected switching circuits 5b and 5d via the output terminals 7 upon radiation of the signals from the antenna elements 8.

As described above, in the splitter circuit of the antenna 100a according to Embodiment 1, several switching circuits arbitrarily selected from the switching circuits 5a-5d are switched to on-states. The characteristic impedance of the second line 12a is the product mZ of the characteristic impedance Z of the first line 10a and the number m of switching circuits. In the configuration described above, signals can propagate from the splitter circuit without impedance mismatch while the directivities of the antenna can be varied and the signal loss in the switching circuits can be reduced, because only one switching circuit is disposed for each antenna element 8.

The splitter circuit in the antenna 100a according to Embodiment 1 requires only one switching circuit for each antenna element 8 whereas a splitter circuit in a conventional antenna requires two switching circuits for each antenna element at one end of a branched line. In the splitter circuit in the antenna 100a according to Embodiment 1, the second lines 12a are connected in parallel to the first line 10a. Thus, the lines transmitting signals have short lengths from the input to the antenna elements 8 radiating signals compared to lines connected by, for example, a conventional tree connection scheme. In general, as the line length increases, the signal loss and the scale of the circuit increase. Thus, the antenna 100a including the splitter circuit according to Embodiment 1 can reduce the signal loss and decrease the size of the circuit compared to an antenna including a conventional splitter circuit provided with switching circuits and lines.

In the splitter circuit of the antenna 100a according to Embodiment 1, each of the n second lines 12a has a length being an odd integral multiple of ¼ of the guide-wavelength in the n second lines 12a at the operating frequency. Thus, the switch terminals of the n–m switching circuits switched to off-states are open at infinite impedance as seen from the branch point 20, and the signal loss can be thereby reduced. The lengths of n second lines 12a may be calculated such that the switch terminals of n–m switching circuits switched to off-states is open as seen from the branch point 20.

In the antenna 100a including the splitter circuit according to Embodiment 1, arbitrary selection of the m switching circuits to be switched to on-states from among the n switching circuits in the branch circuit module 3a does not affect the impedance $Z_a$ as seen from the branch point 20 toward the output terminal 7; hence, impedance mismatch loss does not occur. Thus, m antenna elements 8 are arbitrarily selected from among the antenna elements 8 having various radiation directivities of signals to switch to on-states the switching circuits to be connected to the selected antenna elements 8. The directivity can be readily varied without impedance mismatch.

The antenna 100a including the splitter circuit according to Embodiment 1 represents an exemplary configuration of the branch circuit module 3a including tri-plate strip lines. Alternatively, the branch circuit module 3a may include a combination of strip and coaxial lines.

Figure 4:
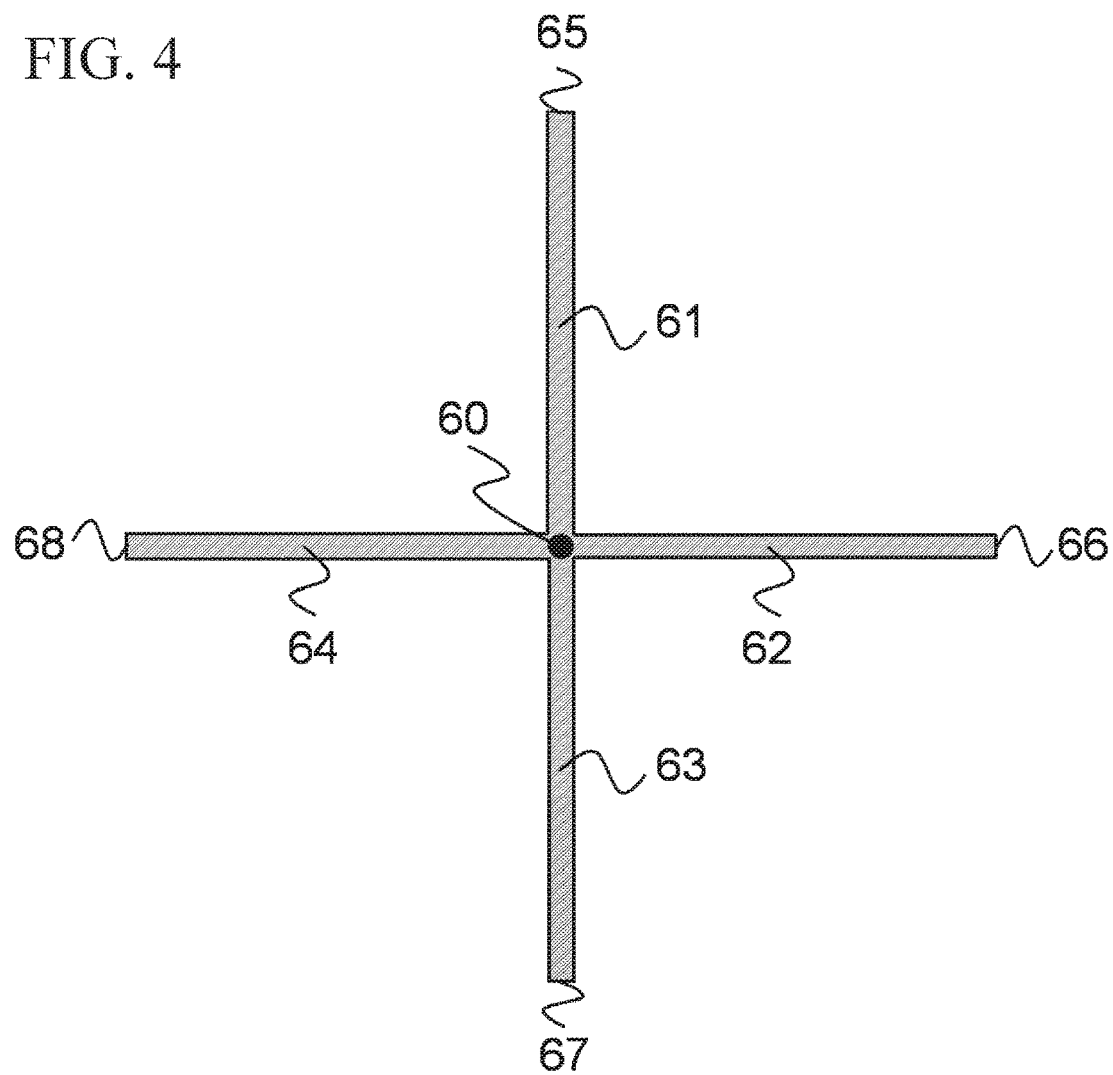
FIG. 4 is a top view of a branch circuit module in another exemplary configuration according to Embodiment 1 of the invention.

FIG. 4 is a top view of another exemplary configuration of the branch circuit module 3a including a combination of strip and coaxial lines according to Embodiment 1 of the present invention. In the branch circuit module in FIG. 4, a branch point 60 including an axial probe correspond to the branch point 20 at the second end of the first line 10a; branched strip lines 61-64 correspond to the four second lines 12a connected to the respective switching circuits 5a-5d; and output terminals 65-68 disposed at the ends of the strip lines 61-64 correspond to the ends of the second lines 12a connected to the switching circuits 5a-5d. In the branch circuit module of FIG. 4, the input terminal 1 and the first line 10a are not depicted. In FIG. 4, the strip lines 61-64 are also branched at branch point 60 in the branch circuit module like FIG. 1.

Figure 5:
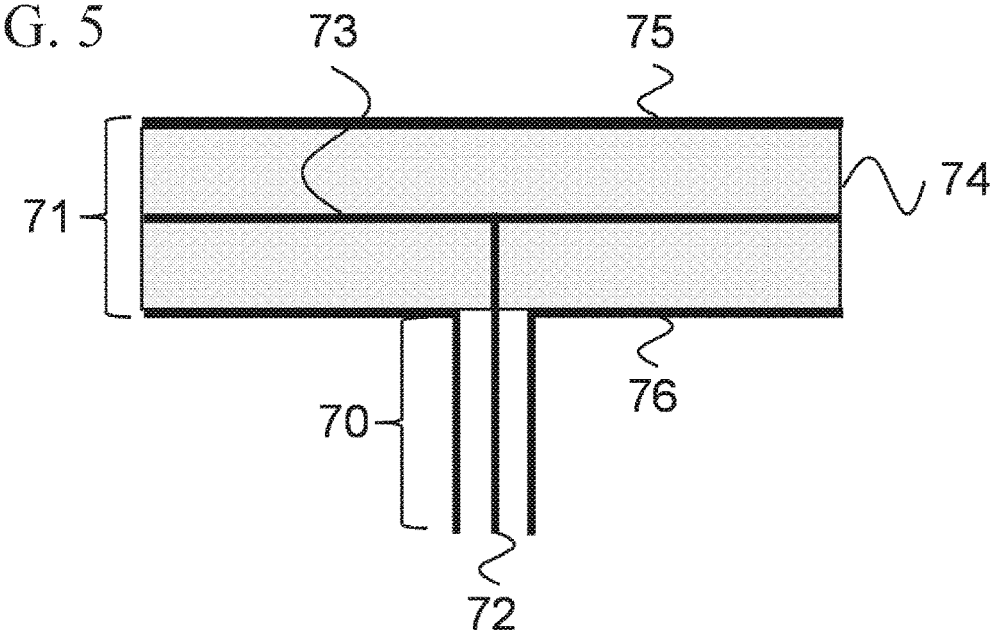
FIG. 5 is a cross-sectional view of the branch circuit module in another exemplary configuration according to Embodiment 1 of the invention.

FIG. 5 is a cross-sectional view of another exemplary configuration of the branch circuit module 3a including a combination of strip and coaxial lines according to Embodiment 1 of the present invention. As illustrated in FIG. 5, a tri-plate strip line 71 includes a strip line 73, a dielectric material 74, a base conductor 75, and a base conductor 76. The tri-plate strip line 71 is vertically connected to a coaxial line 70 at one of its ends. The coaxial line 70 corresponds to the first line 10a and includes a probe 72 for connection to the strip line 73. The coaxial line 70 is connected to the input terminal 1 at the other end. Alternatively, the branch circuit module 3a may include micro-strip lines, waveguides, coaxial lines, or any combination of such components. As described above, the combination of strip lines with a coaxial line to provide a substrate coplanar with the tri-plate strip line 71 allows power to be supplied from the top or bottom of the substrate. Free design of the antenna can be thereby achieved.

In the splitter circuit of the antenna 100a described in Embodiment 1, four antenna elements 8 are provided. Signals from the input terminal 1 are split in four segments. The switching circuits 5b and 5d among the switching circuits 5a-5d are switched to on-states. Alternatively, the number n of antenna elements 8 may be an integer of 2 or more, and the signals from the input terminal 1 may be split in n segments. The number m of n switching circuits to be arbitrarily selected and switched to on-states may be any integer ranging from 1 to n–1. For example, the signals from the input terminal 1 may be split in eight segments, and three switching circuits may be switched to on-states.

Figure 6:
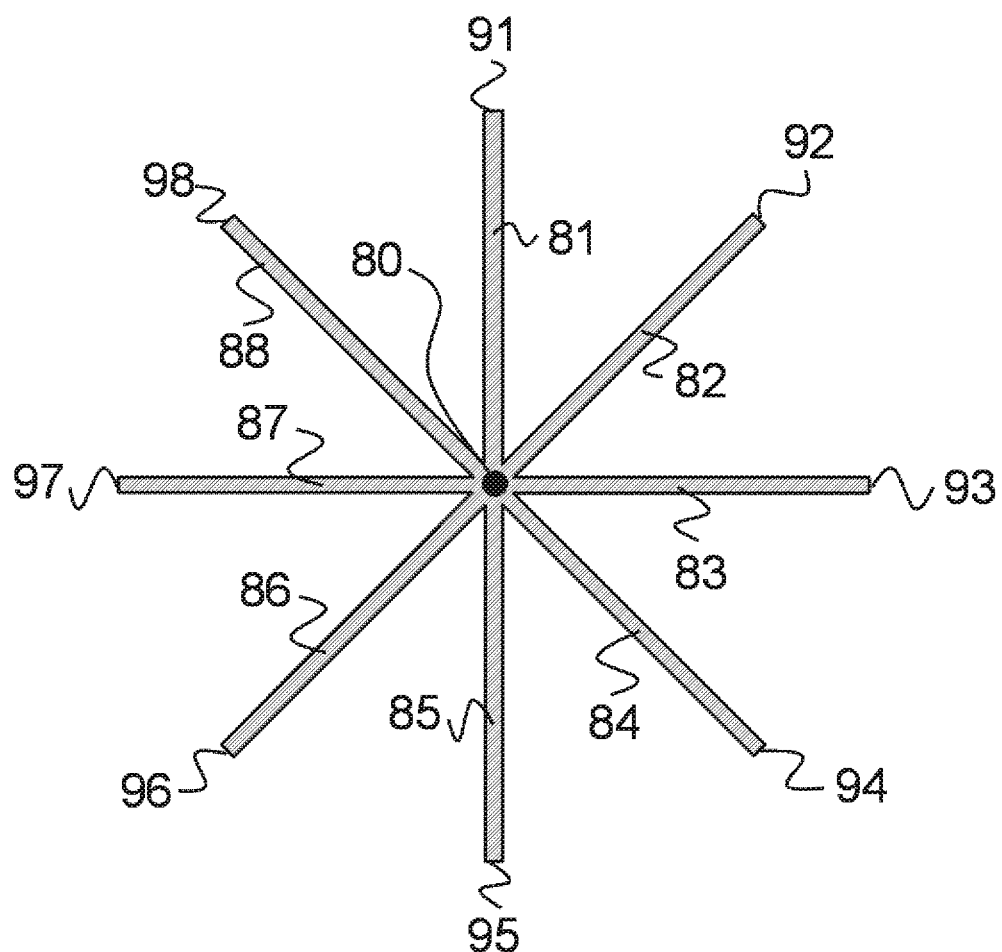
FIG. 6 is a branch circuit module in a further exemplary configuration according to Embodiment 1 of the invention.

FIG. 6 is a top view of another exemplary configuration of the branch circuit module 3a according to Embodiment 1 of the present invention in a case where signals from the input terminal 1 are split in eight segments. In FIG. 6, the branch circuit module includes a combination of strip and coaxial lines like FIG. 4. In the branch circuit module in FIG. 6, the branch point 20 at the second end of the first line 10a corresponds to a branch point 80 including a coaxial probe; the eight second lines 12a connected to the respective switching circuits correspond to branched strip lines 81-88, respectively; and the ends of the eight second lines 12a connected to the switching circuits correspond to output terminals 91-98 of the strip lines 81-88, respectively. In the branch circuit module of FIG. 6, the input terminal 1 and the first line 10a are not depicted. In FIG. 6, eight antenna elements 8 are provided, and the branch point 80 splits signals from the input terminal 1 to eight strip lines 81-88. The number m of switching circuits to be arbitrarily switched to on-states among the eight switching circuits may be any integer ranging from 1 to 7.

The splitter circuit of the antenna 100a according to Embodiment 1 includes the switching circuits 5a-5d. The switching circuits 5a-5d includes the switch terminals 51-53. Alternatively, the number of switch terminals may be any integer of 2 or more.

Embodiment 2

Figure 7:
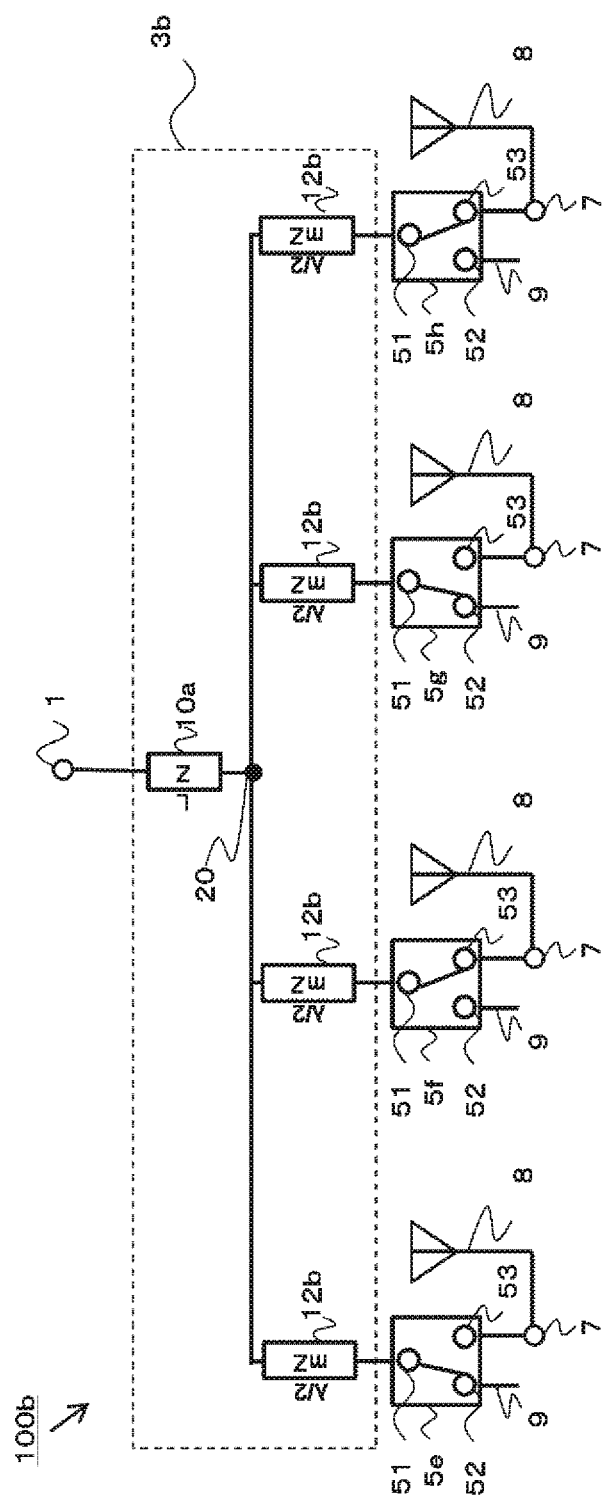
FIG. 7 illustrates a configuration of an antenna according to Embodiment 2 of the invention.

In Embodiment 1, the switch terminals 52 in the respective switching circuits 5a-5d are connected to the ground terminals 6. In order to reduce the impedance mismatch among lines, each second line 12a has a length being an odd integral multiple of ¼ of the guide-wavelength in the four second lines 12a at an operating frequency. In Embodiment 2, the switch terminals 52 of switching circuits 5e-5h are connected to the corresponding open terminals 9 as illustrated in FIG. 7. Second lines 12b each have a length being an integral multiple of ½ of the guide-wavelength in the four second lines 12b at the operating frequency. Signals are thereby transmitted to the splitter circuit without impedance mismatch like Embodiment 1, whereas the directivities of the antenna elements can be varied and the signal loss in the switching circuits can be reduced because only one switching circuit is disposed for each antenna element 8. The other configuration is the same as that of Embodiment 1.

FIG. 7 illustrates a configuration of an antenna 100b according to Embodiment 2 of the present invention. In the following description, the components and their operations that have been already explained will be denoted by the same reference numerals without redundant description.

The antenna 100b according to Embodiment 2 includes a branch circuit module 3b and switching circuits 5e-5h instead of the branch circuit module 3a and the switching circuits 5a-5d in the antenna 100a according to Embodiment 1. The ground terminal 6 is replaced with the open terminal 9. The switching circuits 5e-5h are SPDT switches. The switching circuits 5e-5h may be mechanical switches or electronic switches.

The branch circuit module 3b includes second lines 12b instead of second lines 12a according to Embodiment 1 in FIG. 1. The other configuration is the same as that of Embodiment 1.

The switching circuits 5e-5h have the same configuration. The switch terminals 51 are connected to the four second lines 12b, respectively. The switch terminals 52 are connected to the respective open terminals 9. The other configuration is the same as that of Embodiment 1.

If any of the switching circuits 5e-5f is switched to off-states, the switch terminal 52 is connected to the open terminal 9, and thus the switching circuit is open. In order to reduce the impedance mismatch among the lines, each second line 12b has a length set to an integral multiple of ½ of the guide-wavelength in the four second lines 12b at an operating frequency. In a case where the second line 12b has a length being an integral multiple of ½ of the guide-wavelength in the four second lines 12b at the operating frequency, the switch terminal 52 of the switching circuit switched to an off-state is open at infinite impedance as seen from the branch point 20. Like Embodiment 1, when the guide-wavelength in the four second lines 12b at the operating frequency is expressed as λ, then the length of each second line 12b is λ/2. If the configuration of Embodiment 2 is applied to the branch circuit module 3b in FIG. 2, the lengths from the branch point 40 to each of output terminals 36-39 at the ends of the strip lines are λ/2, respectively.

The antenna 100b operates in the same manner as the antenna 100a. It should be noted, however, that the antenna 100b includes the branch circuit module 3b instead of the branch circuit module 3a, the second lines 12b instead of the second lines 12a, the switching circuits 5e-5h instead of the switching circuits 5a-5d, and the open terminals 9 instead of the ground terminals 6.

As described above, in the splitter circuit of the antenna 100b according to Embodiment 2, several switching circuits arbitrarily selected from the switching circuits 5e-5h are switched to on-states. The characteristic impedance of the second line 12b is the product mZ of the characteristic impedance Z of the first line 10a and the number m of selected switching circuits. In such a configuration, signals can be transmitted from the splitter circuit without impedance mismatch whereas the directivities of the antenna elements can be varied and the signal loss in the switching circuits can be reduced because only one switching circuit is disposed for each antenna element 8.

The antenna 100b including the splitter circuit according to Embodiment 2 requires only one switching circuit for each antenna element 8 in contrast to the conventional antenna requiring two switching circuits disposed at one end of a branched line for each antenna element. In the splitter circuit of the antenna 100b according to Embodiment 2, the second lines 12b are connected in parallel to the first line 10a and thus have short lengths from the input to the antenna elements 8 radiating signals compared to lines connected by, for example, a conventional tree connection scheme. In general, as the line length increases, the signal loss and the scale of the circuit increase. Thus, the antenna 100b including the splitter circuit according to Embodiment 2 can reduce the signal loss and decrease the size of the circuit compared to an antenna including a conventional splitter circuit provided with switching circuits and lines.

In the splitter circuit of the antenna 100b according to Embodiment 2, each of the n second lines 12b has a length being integral multiple of ½ of the guide-wavelength in the n second lines 12b at the operating frequency. Thus, the switch terminals of the n−m switching circuits switched to off-states are open at infinite impedance as seen from the branch point 20, and the signal loss can be thereby reduced. The lengths of the n second lines 12b may be calculated such that the switch terminals of the n−m switching circuits switched to off-states is open as seen from the branch point 20.

In the antenna 100b including the splitter circuit according to Embodiment 2, arbitrary selection of the m switching circuits to be switched to on-states from the n switching circuits in the branch circuit module 3b does not affect the impedance $Z_a$ as seen from the branch point 20 toward the output terminal 7; hence, impedance mismatch loss does not occur. Thus, m antenna elements 8 are arbitrarily selected from the antenna elements 8 having various radiation directivities of signals to switch to on-states the switching circuits to be connected to the selected antenna elements 8. The directivity can be readily varied without impedance mismatch.

Embodiment 3

Figure 8:
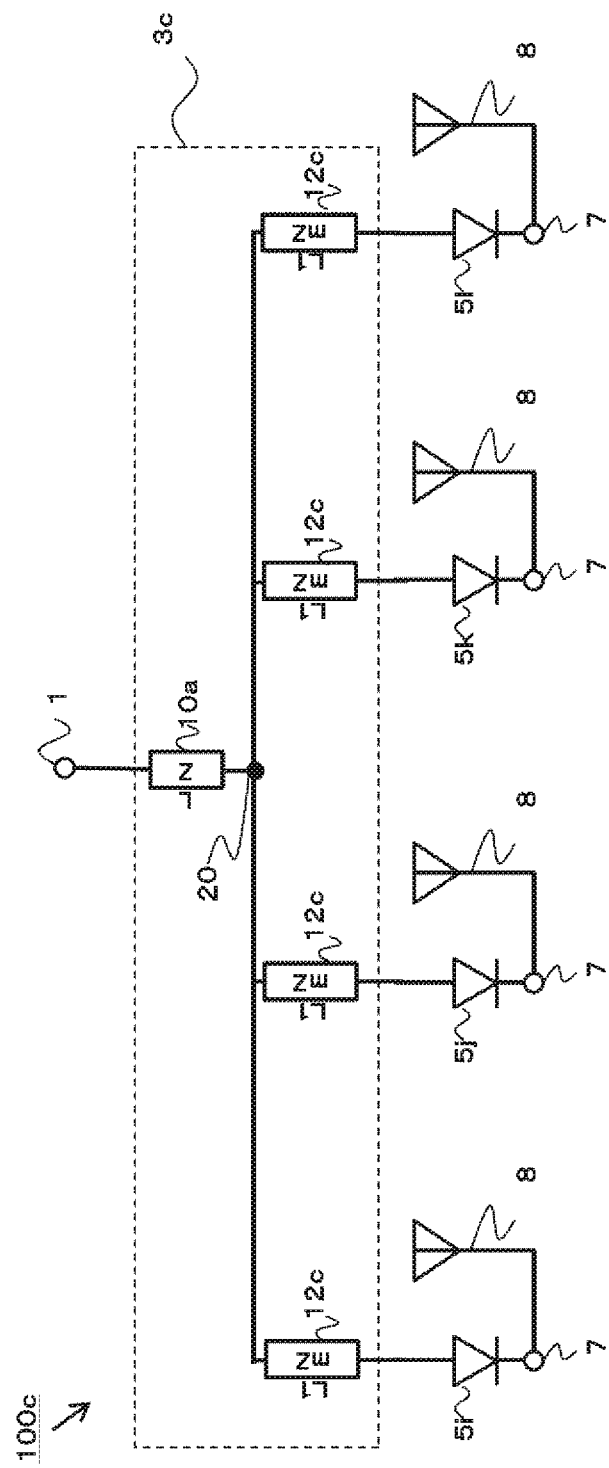
FIG. 8 illustrates a configuration of an antenna according to Embodiment 3 of the invention.

In Embodiment 1, the switching circuits 5a-5d are switched to on-states or off-states to vary the directivity. In Embodiment 3, instead of the switching circuits 5a-5d, diode switches 5i-5l are switched to on-states or off-states to vary the directivity as illustrated in FIG. 8. Thus, like Embodiment 1, signals can be transmitted from the splitter circuit without impedance mismatch whereas the directivities of the antenna elements can be varied and the signal loss in the switching circuits can be reduced because only one switching circuit is disposed for each antenna element 8. The other configuration is the same as that of Embodiment 1.

FIG. 8 illustrates a configuration of an antenna 100c according to Embodiment 3 of the present invention. In the following description, the components and their operations that have been already explained will be denoted by the same reference numerals without redundant description.

The antenna 100c according to Embodiment 3 includes a branch circuit module 3c instead of the branch circuit module 3a in the antenna 100a according to Embodiment 1 and diode switches 5i-5l instead of the switching circuits 5a-5d. It should be noted that the ground terminals 6 are not required.

The branch circuit module 3c includes second lines 12c instead of the second lines 12a according to Embodiment 1 in FIG. 1. The second lines 12c each have a length L1, where L1 is an odd integral multiple of ¼ of the guide-wavelength in the four second lines 12c at their operating frequency like Embodiment 1 if the diode switches 5i-5l switched to off-states are short-circuited. L1 is an integral multiple of ½ of the guide-wavelength in the four second lines 12c at their operating frequency like Embodiment 2 if the diode switches 5i-5l switched to off-states are open. If the configuration of Embodiment 3 is applied to the branch circuit module 3c in FIG. 2, then the lengths from the branch point 40 to each of the output terminals 36-39 at the ends of the strip lines are L1, respectively. The other configuration is the same as that of Embodiment 1.

The diode switches 5i-5l have the same configuration. The diode switches 5i-5l are disposed between second ends of the second lines 12c and the output terminals 7, respectively. The diode switches 5i-5l connect or disconnect the second ends of the four second lines 12c to/from the four output terminals 7, respectively. In detail, the diode switches 5i-5l are switched to on-states or off-states by application of voltages. The diode switches 5i-5l respectively include control circuits that controls diode switches 5i-5l, which are switched to on-states or off-states by the control circuits.

The antenna 100c operates in the same manner as the antenna 100a. It should be noted, however, that the antenna 100c includes the branch circuit module 3c instead of the branch circuit module 3a, the second lines 12c instead of the second lines 12a, and the diode switches 5i-5l instead of the switching circuits 5a-5d.

As described above, in the splitter circuit of the antenna 100c according to Embodiment 3, several diode switches arbitrarily selected from the diode switches 5i-5l are switched to on-states. The characteristic impedance of the second line 12c is the product mZ of the characteristic impedance Z of the first line 10a and the number m of selected diode switches. In such a configuration, signals can be transmitted from the splitter circuit without impedance mismatch whereas the directivities of the antenna elements can be varied and the signal loss in the diode switches can be reduced because only one diode switch is disposed for each antenna element 8.

The antenna 100c including the splitter circuit according to Embodiment 3 requires only one diode switch for each antenna element 8 in contrast to the conventional antenna requiring two switching circuits at one end of a branched line. In the splitter circuit in the antenna 100c according to Embodiment 3, the second lines 12c are connected in parallel to the first line 10a in contrast to a conventional line connection scheme, such as tree connection scheme. The lines thus have short lengths from the input to the antenna elements 8 radiating signals. In general, as the line length increases, the signal loss and the scale of the circuit increase. Thus, the antenna 100c including the splitter circuit according to Embodiment 3 can reduce the signal loss and decrease the size of the circuit compared to an antenna including a conventional splitter circuit provided with switching circuits and lines.

In the antenna 100c including the splitter circuit according to Embodiment 3, arbitrary selection of the m diode switches to be switched to on-states from among the n diode switches in the branch circuit module 3c does not affect the impedance $Z_a$ as seen from the branch point 20 toward the output terminal 7; hence, impedance mismatch loss does not occur. Thus, m antenna elements 8 are arbitrarily selected from the n antenna elements 8 having various radiation directivities of signals to switch to on-states the diode switches to be connected to the selected antenna elements 8. The directivity can be readily varied without impedance mismatch.

Embodiment 4

Figure 9:
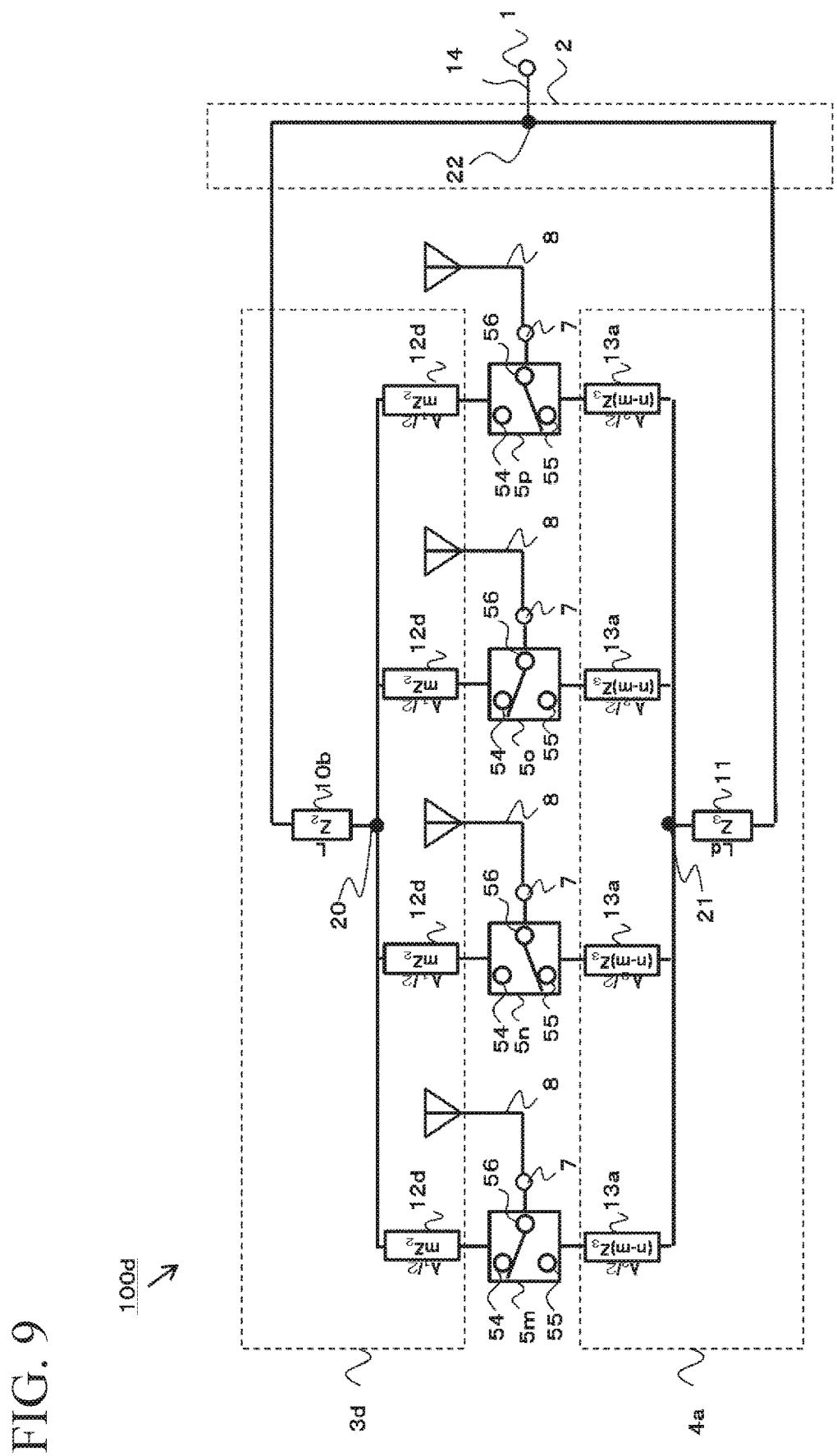
FIG. 9 illustrates a configuration of an antenna according to Embodiment 4 of the invention.

In Embodiment 1, the antenna elements 8 have different radiation directivities, and the switching circuits 5a-5d each include a switch terminal 51 connected to a second line 12a, a switch terminal 52 connected to a ground terminal 6, and a switch terminal 53 connected to an output terminal 7. The switch terminal 51 is connected to the switch terminal 52 or to the switch terminal 53. In Embodiment 4, a branch circuit module 2 and a branch circuit module 4a each including a delay line 11 are further provided, as illustrated in FIG. 9. Four switching circuits 5m-5p each include a switch terminal 54 connected to a fourth line 12d, a switch terminal 55 connected to a fifth line 13a connected to a third line or a delay line, and a switch terminal 56 connected to an output terminal 7. The switch terminal 54 is selectively connected to the switch terminal 56 or the switch terminal 55 is selectively connected to the switch terminal 56. Signals can be transmitted from a splitter circuit without impedance mismatch like Embodiment 1, whereas the directivities of the antenna elements can be varied and the signal loss in the switching circuits can be reduced because only one switching component is disposed for each antenna element 8. Furthermore, the antenna elements 8 need not have different radiation directivities because the selection of the second line 10b or the delay line 11 can vary the directivity.

FIG. 9 illustrates a configuration of an antenna 100d according to Embodiment 4 of the present invention.

The antenna 100d in FIG. 9 includes a splitter circuit and n antenna elements 8 connected to the splitter circuit, where n is an integer of 2 or more. Although the antenna elements 8 radiate signals, they need not be disposed so as to have different radiation directivities like the antenna elements 8 according to Embodiment 1. The antenna 100d including four antenna elements 8 will now be described.

The splitter circuit includes an input terminal 1 receiving signals, a branch circuit module 2 connected to the input terminal 1, a branch circuit module 3d connected to the branch circuit module 2 at one end, a branch circuit module 4a connected to the branch circuit module 2 at one end, four switching circuits 5m-5p connected to the branch circuit module 3d at one end and connected to the branch circuit module 4a at the other end, and four output terminals 7 that are connected between the four switching circuits 5m-5p and the four antenna elements 8 and transmit signals from the input terminal 1. The switching circuits 5m-5p are SPDT switches. The switching circuits 5m-5p may be physical switches or electronic switches. In Embodiment 4, the switching circuits 5m-5p are physical switches.

The branch circuit module 2 includes a first line 14 having one end connected to the input terminal 1. The branch circuit module 2 has a branch point 22 at a second end of the first line 14. Hereinafter, the characteristic impedance of the first line 14 is denoted by $Z_1$, and the length of the first line 14 is denoted by $L_1$. The first line 14 has a characteristic impedance of 25Ω.

The branch circuit module 3d includes a second line 10b having a first end connected to the branch point 22 at the second end of the first line 14 and four fourth lines 12d having first ends connected to a branch point 20 at the second end of the second line 10b and second ends connected to the corresponding switching circuits 5m-5p. Hereinafter, the characteristic impedance of the second line 10b is denoted by $Z_2$ and the length of the second line 10b is denoted by L. The characteristic impedance of each of the four fourth lines 12d is denoted by $Z_4$. The second line 10b has a characteristic impedance of 50Ω.

In the branch circuit module 4a, a third line 11 has a first end connected to the second end of the first line 14 at the branch point 22 in parallel with the second line 10b and allows signals with a different delay time from that of the second line 10b to pass through. Four fifth lines 13a (equal to the fourth lines 12d in number) each have a first end connected to the second end of the third line 11 at the branch point 21. The four fifth lines 13a each have a second end connected to the corresponding switching circuits 5m-5p. Hereinafter, the characteristic impedance of the third line 11 is denoted by $Z_3$, the length of the third line 11 is denoted by Ld, and the characteristic impedance of each of the four fifth line 13a is denoted by $Z_5$. The third line 11 has a characteristic impedance of 50Ω. In a case where the second line 10b has the same transmission rate of signals per unit length as the third line 11, the length Ld of the third line 11 is larger than the length L of second line 10b.

The switching circuit 5m-5p have the same configuration. The switching circuits 5m-5p are disposed between the second ends of the four fourth line 12d and the four output terminals 7 or between the second ends of the four fifth line 13a and the four output terminals 7. The switching circuits 5m-5p connect or disconnect the four output terminals 7 to/from the second ends of the four fourth lines 12d or the second ends of the four fifth lines 13a. In detail, the switching circuits 5m-5p each include a switch terminal 54 for connection to the fourth line 12d, a switch terminal 55 for connection to the fifth line 13a, and a switch terminal 56 for connection to the output terminal 7. Thereby, the switch terminal 54 is connected to the switch terminal 56, or the switch terminal 55 is connected to the switch terminal 56. The switching circuits 5m-5p respectively include control circuits that control the switching circuits 5m-5p. The control circuits connect or disconnect the fourth lines 12d to/from the output terminals 7 or the fifth lines 13a to/from the output terminals 7.

When the switching circuits 5m-5p are connected to the fourth lines 12d and the output terminals 7, the fifth lines 13a are open. When the switching circuits 5m-5p are connected to the fifth lines 13a and the output terminals 7, the fourth lines 12d are open. Thus, each fourth line 12d has a length of an integral multiple of ½ of the guide-wavelength in the four fourth lines 12d at an operating frequency to reduce the impedance mismatch among the lines. Each fifth line 13a also has a length of an integral multiple of ½ of the guide-wavelength in the four fifth lines 13a at the operating frequency. In a case where each fourth line 12d has a length being an integral multiple of ½ of the guide-wavelength in the four fourth lines 12d at the operating frequency and each fifth line 13a has a length being an integral multiple of ½ of the guide-wavelength in the four fifth lines 13a at the operating frequency, the switch terminals 54 of the switching circuits 5n and 5p that are not connected to the corresponding output terminals 7 or the switch terminals 55 of the switching circuits 5m and 5o are open at infinite impedance as seen from the branch point 20 or branch point 21, for example, as illustrated in FIG. 9. Let the guide-wavelength in the four fourth lines 12d at the operating frequency be $\lambda_1$, then the length of each fourth line 12d is $\lambda_1/2$. Let the guide-wavelength in the four fifth lines 13a at the operating frequency be $\lambda_2$, then the length of each fifth line 13a is $\lambda_2/2$.

The operation of the antenna 100d will now be explained.

When the input terminal 1 receives signals, the signals propagates from the input terminal 1 via the first line 14 to the branch circuit module 2. The signals reaching the branch circuit module 2 are split in two segments at the branch point 22 in the branch circuit module 2 and propagate to the second and third lines 10b and 11. The signals propagate through the second line 10b to the branch circuit module 3d. The signals propagating through the branch circuit module 3d are split in four segments at the branch point 20 in the branch circuit module 3d and are transmitted to the fourth lines 12d, through which the signals propagate to the switch terminals 54 of the switching circuits 5m-5p, respectively. The signals are also transmitted via the third line 11 to the branch circuit module 4a. The signals transmitted to the branch circuit module 4a are split in four segments at the branch point 21 in the branch circuit module 4a and are transmitted to fifth lines 13a. The signals propagate through the fifth lines 13a to the switch terminals 55 of the switching circuits 5m-5p, respectively.

Among the switching circuits 5m-5p, m arbitrarily selected switching circuits are switched to connect the fourth lines 12d to the output terminals 7. A possible range of m will be described below. The number of switching circuits connecting the fifth lines 13a to the output terminals 7 is n–m. In Embodiment 4, the switching circuits 5m and 5o are switched to connect with the second ends of the fourth lines 12d, and the remaining switching circuits 5n and 5p are switched to connect with the second ends of the fifth lines 13a.

The impedance as seen from the branch point 20 toward the output terminal 7 is hereinafter denoted by $Z_c$. The impedance matching before and after the split of signals at the branch point 20 will be discussed. The number of antenna elements 8 is denoted by n. Among n switching circuits, m switching circuits are arbitrarily switched to be connected to the second ends of the fourth lines 12d. The characteristic impedance of the second line 10b is denoted by $Z_2$. The characteristic impedance of each fourth line 12d is denoted by $Z_4$. The number n of antenna elements 8 is an integer of 2 or more. The number m of switching circuits arbitrarily switched to the second ends of the fourth lines 12d among n switching circuits is an integer ranging from 1 to n–1. In a case where the n fourth lines 12d each have a length of an integral multiple of ½ of the guide-wavelength in the n fourth lines 12d at an operating frequency, the terminals of n–m switching circuits switched to connect with the second ends of the fifth lines 13a are open at infinite impedance as seen from the branch point 20. The terminals of the m switching circuits switched to connect with the second ends of the fourth lines 12d are connected in parallel to the lines having the characteristic impedance $Z_4$. Thus, let the impedance as seen from the branch point 20 toward the output terminal 7 be $Z_c$, then Expression (1) can be transformed into Expression (2) including $Z_c$ instead of $Z_a$ and $Z_4$ instead of $Z_b$.

[Expression 2]

$$Z_c = \frac{Z_4}{m} \quad (2)$$

Meanwhile, the second line 10b has a characteristic impedance $Z_2$, which is the impedance as seen from the branch point 20 toward the input terminal 1. In order to reduce the signal loss, $Z_c$ should be equal to $Z_2$ for the impedance matching before and after the split of signals at the branch point 20. Thus, the impedance mismatching does not occur if the characteristic impedance $Z_4$ of each fourth line 12d is equal to $mZ_2$ or a product between the characteristic impedance of the second line 10b and the number m of the switching circuits switched to connect with the second ends of the fourth lines 12d. Arbitrary selection of the m switching circuits to be switched to connect with the second ends of the fourth lines 12d from among the n switching circuits does not affect the impedance $Z_c$ as seen from the branch point 20 toward the output terminals 7, and thus an impedance mismatch loss does not occur. In the following description, the characteristic impedance of each fourth line 12d is denoted by $mZ_2$.

The impedance as seen from the branch point 21 toward the output terminal 7 is hereinafter denoted by $Z_d$. The impedance matching before and after the split of signals at the branch point 21 will be discussed. n antenna elements 8 are provided. Among n switching circuits, n–m switching circuits are switched to connect with the second ends of the fifth lines 13a. The characteristic impedance of the third line 11 is denoted by $Z_3$, and the characteristic impedance of each fifth line 13a is denoted by $Z_5$. It should be noted that the number n−m of switching circuits arbitrarily switched to connect with the second ends of the fifth lines 13a is an integer ranging from 1 to n−1. In a case where the n fifth lines 13a each have a length of an integer multiple of ½ of the guide-wavelength in the n fifth lines 13a at an operating frequency, the terminals of the m switching circuits to be switched to connect with the second ends of the fourth lines 12d are open at infinite impedance as seen from the branch point 21. The terminals of the n−m switching circuits switched to connect with the second ends of the fifth lines 13a are connected in parallel to the lines having the characteristic impedance $Z_5$. Thus, let the impedance as seen from the branch point 21 toward the output terminal 7 be $Z_d$, then Expression (1) can be transformed into Expression (3) including $Z_d$ instead of $Z_a$ and $Z_5$ instead of $Z_b$.

[Expression 3]

$$Z_d = \frac{Z_5}{(n-m)} \quad (3)$$

Meanwhile, the third line 11 has a characteristic impedance $Z_3$, which is the impedance as seen from the branch point 21 toward the input terminal 1. In order to reduce the signal loss, $Z_d$ should be equal to $Z_3$ for impedance matching before and after the split of signals at the branch point 21. Thus, the impedance mismatching does not occur if the characteristic impedance $Z_5$ of each fifth line 13a is equal to (n−m)·$Z_3$ that is a product between the characteristic impedance of the third line 11 and the number of the n−m switching circuits switched to connect with the second ends of the fifth lines 13a. Arbitrary selection of the switching circuits to be switched to connect with the second ends of the fifth lines 13a from among the n switching circuits does not affect the impedance $Z_d$ as seen from the branch point 21 toward the output terminals 7, and thus the impedance mismatch loss does not occur. In the following description, the characteristic impedance of each fifth line 13a is denoted by (n−m)·$Z_3$.

The characteristic impedance of each of the fourth line 12d and the fifth line 13a will now be described in detail. In Embodiment 4, four antenna elements 8 are provided. Among the four switching circuits 5m-5p, two switching circuits 5m and 5o are arbitrarily switched to connect with the second ends of the four fourth lines 12d. The remaining two switching circuits 5n and 5p are arbitrarily switched to connect with the second ends of the fifth lines 13a. The second line 10b has a characteristic impedance of 50Ω. The third line 11 has a characteristic impedance of 50Ω. Each fourth line 12d has a length of $\lambda_1/2$. Each fifth line 13a has a length of $\lambda_2/2$.

The switch terminals 54 of the switching circuits 5n and 5p switched to connect with the second ends of the fifth lines 13a are open at infinity impedance as seen from the branch point 20, respectively. The two switch terminals 54 of the switching circuits 5m and 5o switched to connect with the second ends of the other fourth lines 12d are connected in parallel. If the characteristic impedance $Z_4$ of each fourth line 12d under the condition above is 100Ω that is a product between the characteristic impedance "50Ω" of the second line 10b and the number "2" of switching circuits switched to connect with the second ends of the fourth lines 12d, the impedance mismatch does not occur.

The respective switch terminals 55 of the switching circuits 5m and 5o switched to connect with the second ends of the fourth lines 12d are open at infinity impedance as seen from the branch point 21. The switch terminals 55 of the switching circuits 5n and 5p switched to connect with the second ends of the fifth lines 13a are connected in parallel, respectively. If the characteristic impedance $Z_5$ of each fifth line 13a under the condition above is 100Ω or a product between the characteristic impedance "50Ω" of the third line 11 and the number "2" of switching circuits switched to connect with the second ends of the fifth lines 13a, the impedance mismatch does not occur.

The operation of the antenna 100d will be explained again. The selected switching circuits 5m and 5o are each connected to the corresponding second end of the fourth line 12d and the corresponding output terminal 7 whereas the selected switching circuits 5n and 5p are each connected to the corresponding second end of the fifth line 13a and to the corresponding output terminal 7. Signals through the fourth lines 12d propagate through the switching circuits 5m and 5o to the output terminals 7. Signals through the fifth lines 13a propagate through the switching circuits 5n and 5p to the output terminals 7. The signals through the respective output terminals 7 are transmitted to the corresponding antenna elements 8, which radiate the signals. Since the third line 11 transmits a signal with a delay time different from that of the second line 10b, the signals through the fifth lines 13a are delayed compared to the signals through the fourth lines 12d. Thus, selection of the switching circuits enables the four antenna elements 8 to vary the directivities of the signals from the output terminals 7 and radiate the signals.

As described above, in the splitter circuit of the antenna 100d according to Embodiment 4, the switching circuits 5m and 5o arbitrarily selected from the switching circuits 5m-5p are switched to connect with the fourth lines 12d. The remaining switching circuits 5n and 5p are switched to connect with the fifth lines 13a. The characteristic impedance of each fourth line 12d is m$Z_2$ that is a product between the characteristic impedance $Z_2$ of the second line 10b and the number m of the fourth lines 12d connected to the output terminals 7. The characteristic impedance of each fifth line 13a is (n−m)·$Z_3$ that is a product between the characteristic impedance $Z_3$ of the third line 11 and the number n−m of fifth lines 13a connected to the output terminals 7. In the configuration described above, signals can propagate from the splitter circuit without impedance mismatch whereas the directivities of the antenna elements can be varied and the signal loss in the switching circuits can be reduced, because only one switching circuit is disposed for each antenna element 8.

The splitter circuit in the antenna 100d according to Embodiment 4 requires only one switching circuit for each antenna element 8 whereas a splitter circuit in a conventional antenna requires two switching circuits for each antenna element at one end of a branched line. In the splitter circuit in the antenna 100d according to Embodiment 4, the fourth lines 12d and the fifth lines 13a are connected in parallel to the second line 10b and the third line 11, respectively, in contrast to a conventional line connection scheme, such as tree connection scheme. The lines thus have short lengths from the input to the antenna elements 8 radiating signals. In general, as the line length increases, the signal loss and the scale of the circuit increase. Thus, the antenna 100d including the splitter circuit according to Embodiment 4 can reduce the signal loss and decrease the size of the circuit compared to an antenna including a conventional splitter circuits provided with switching circuits and lines.

In the antenna 100d including the splitter circuit according to Embodiment 4, the third line 11 transmits a signal with a delay time different from that of the second line 10b. Thus the signals through the fifth lines 13a are delayed compared to the signals through the fourth lines 12d; hence, even if the four antenna elements 8 do not have different directivities, the antenna elements 8 can vary the directivities and radiate the signals from the output terminals 7. It should be noted that the delay time can be arbitrarily determined by the length of the delay line.

In the antenna 100d including the splitter circuit according to Embodiment 4, the n fourth lines 12d each has a length of an integral multiple of ½ of the guide-wavelength in the n fourth lines 12d at the operating frequency. The n fifth lines 13a each has a length of an integral multiple of ½ of the guide-wavelength in the n fifth lines 13a at the operating frequency. Thus, the terminals of the n–m switching circuits connected to the second ends of the fifth lines 13a are open at infinite impedance as seen from the branch point 20, and the signal loss can be reduced. The terminals of the m switching circuits switched to connect with the second ends of the fourth lines 12d are open at infinite impedance as seen from the branch point 21, and the signal loss can be reduced. It should be noted that the length of the fourth line 12d or the fifth line 13a may be calculated such that the terminal of the switching circuit is open as seen from the branch point 20 or the branch point 21.

In the splitter circuit of the antenna 100d according to Embodiment 4, the arbitrary selection of the m switching circuits connected to the second ends of the fourth lines 12d and the output terminals 7 and the n–m switching circuits connected to the second ends of the fifth lines 13a and the output terminals 7 among the n switching circuits does not affect the impedance Z, or impedance $Z_d$ as seen from the branch point 20 or the branch point 21 toward the output terminals 7. Thus, the impedance mismatch loss does not occur and the directivity can be readily varied.

In the antenna 100d including the splitter circuit according to Embodiment 4, the branch circuit module 2, the branch circuit module 3d, and the branch circuit module 4a may include tri-plate strip lines like Embodiment 1. The branch circuit module 2, the branch circuit module 3d, and the branch circuit module 4a may also include a combination of strip lines with coaxial lines.

In accordance with the antenna 100d including the splitter circuit of Embodiment 4, the antenna 100d includes the four antenna elements 8. Signals from the input terminal 1 are split into two segments in the branch circuit module 2, split into four segments in the branch circuit module 3d, and split into four segments in the branch circuit module 4a. In the description, two switching circuits 5m and 5o are switched to connect with the respective second ends of the fourth lines 12d whereas the remaining two switching circuits 5n and 5p are switched to connect with the respective second ends of the fifth lines 13a. Alternatively, the number n of antenna elements 8 may be an integer of 2 or more, and the signals from the input terminal 1 may be split into any number of segments in the branch circuit module 2, the branch circuit module 3d, and the branch circuit module 4a. It should be noted, however, that the same number of branch circuit modules as that of split segments in the branch circuit module 2 is required so that signals are transmitted to at least two of the antenna elements 8 and radiated through the respective branch circuit modules having different delay times. Equal numbers of branch circuit modules 3d and branch circuit modules 4a have been described. Alternatively, different numbers of branch circuit modules 3d and branch circuit modules 4a may be provided. Furthermore, any number of switching circuits to be switched to connect with the second ends of the fourth lines 12d and with the second ends of the fifth lines 13a, respectively, may be arbitrarily selected from the n switching circuits as long as the number m of switching circuits to be arbitrarily switched to connect with the second ends of the fourth lines 12d is set to an integer ranging from 1 to n–1 and the number n–m of switching circuits to be arbitrarily switched to connect with the second ends of the fifth lines 13a is set to an integer ranging from 1 to n–1.

Figure 10:
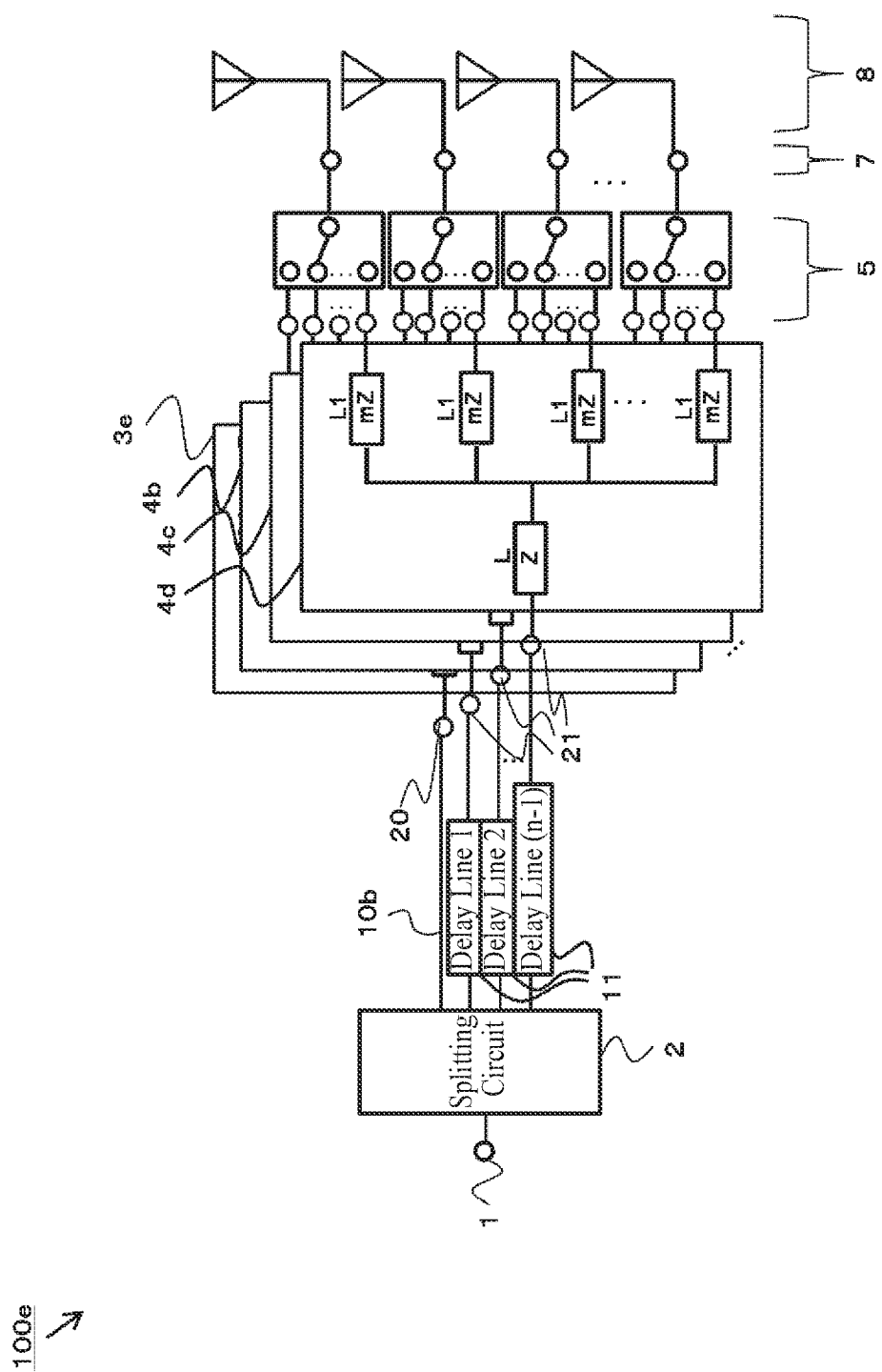
FIG. 10 illustrates a configuration of another antenna according to Embodiment 4 of the invention.

FIG. 10 illustrates a configuration of another antenna 100e according to Embodiment 4 of the present invention. The antenna 100e includes several third lines 11 that are different delay lines in the antenna 100d, branch circuit modules 4b-4d, switching circuits 5 that are single-input/multiple-output switches, output terminals 7, and antenna elements 8. As described above, the antenna 100e may include different delay lines. Since the antenna 100e includes different delay lines, distinct directivities can be increased and the degree of freedom in design of the antenna can be improved The splitter circuit in the antenna 100d according to Embodiment 4 has been described where the antenna 100d includes the switching circuits 5m-5p and the switching circuits 5m-5p include the switch terminals 54-56. Alternatively, the number of switch terminals may be any integer of 2 or more.

In the splitter circuit of the antenna 100d according to Embodiment 4, for example, no other switch terminal than the output terminal 7 may be connected to the switch terminal 56.

In the splitter circuit of the antenna 100d according to Embodiment 4, the four switching circuits 5m-5p are mechanical switches. In order to reduce the impedance mismatch among the lines, each fourth line 12d has a length of an integral multiple of ½ of the guide-wavelength in the four fourth lines 12d at the operating frequency. Each fifth line 13a has a length of an integral multiple of ½ of the guide-wavelength in the four fifth lines 13a at the operating frequency. Alternatively, the four switching circuits 5m-5p may be electronic switches. In a case where the four switching circuits 5m-5p are electronic switches and either the fourth lines 12d or the fifth lines 13a are short-circuited, each fourth line 12d has a length of an odd integral multiple of ¼ of the guide-wavelength in the four fourth lines 12d at the operating frequency to reduce the impedance mismatch among the lines like Embodiment 1. Each fifth line 13a also has a length of an odd integral multiple of ¼ of the guide-wavelength in the four fifth lines 13a at the operating frequency. In a case where the four switching circuits 5m-5p are electronic switches and the fourth lines 12d or the fifth lines 13a is open, the geometry is the same as that in Embodiment 4.

In the splitter circuit of the antenna 100d according to Embodiment 4, the four switching circuits 5m-5p are SPDT switches. Alternatively, the switching circuits each may include two diode switches. In other words, the fourth line 12d and the fifth line 13a each may be connected to a diode switch such that the diode switch connected to the fourth line 12d and the diode switch connected to the fifth line 13a are connected to the same output terminal 7.

Embodiment 5

Figure 11:
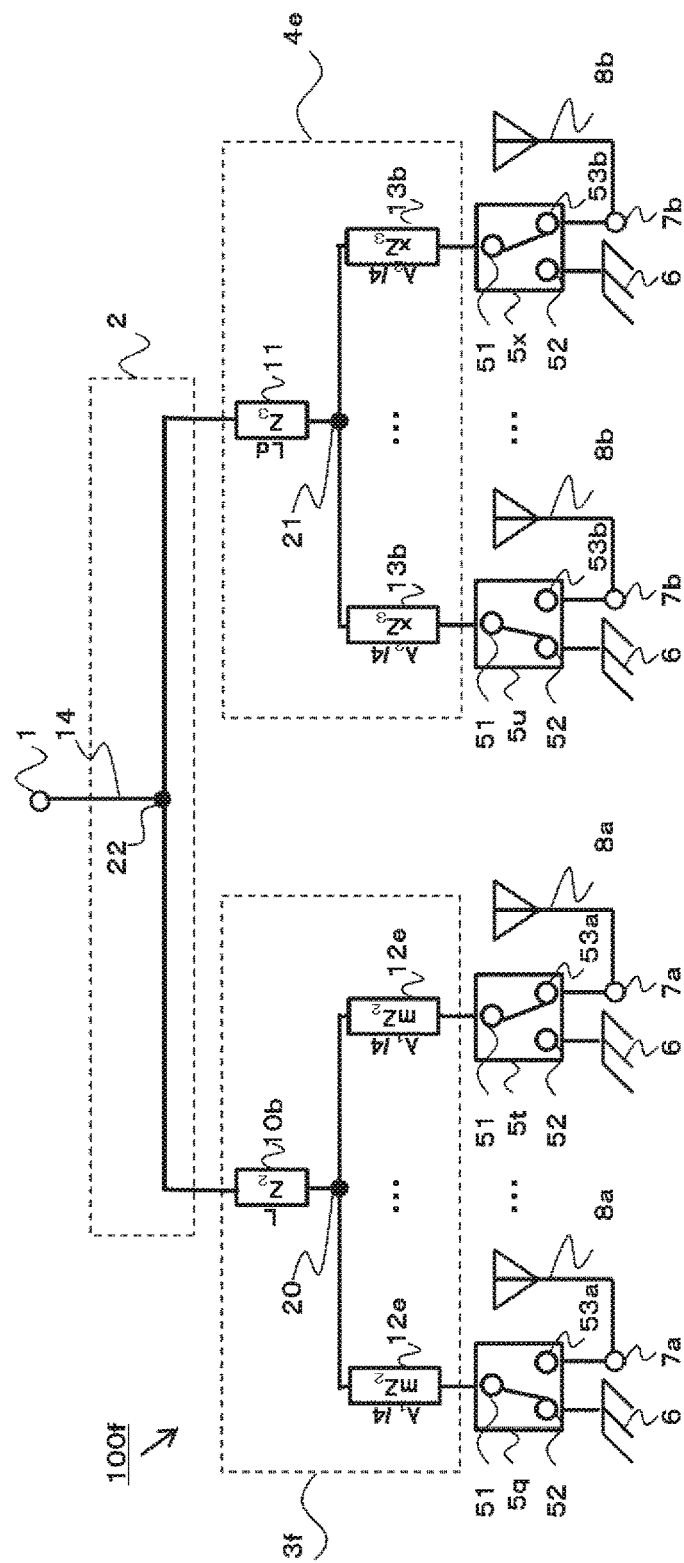
FIG. 11 illustrates a configuration of an antenna according to Embodiment 5 of the invention.

In Embodiment 1, the four antenna elements 8 have different radiation directivities and the switching circuits 5a-5d are switched to on-states or off-states. In Embodiment 5, a splitter circuit 3f has the same configuration as the splitter circuit in Embodiment 1, and a splitter circuit 4e includes a line 11 connected in parallel and has a different delay time, as illustrated in FIG. 11. Thus, signals can be transmitted from the splitter circuit without impedance mismatch like Embodiment 1, while the directivities of the antenna elements can be varied and the signal loss in the switching circuits can be reduced because only one switching circuit is disposed for each first antenna element 8a or second antenna element 8b. Furthermore, the antenna elements need not have different directivities because the selection of a second line 10b and a delay line 11 can vary the directivity.

FIG. 11 illustrates a configuration of the antenna 100f according to Embodiment 5 of the present invention.

In FIG. 11, the antenna 100f includes a splitter circuit, n first antenna elements 8a connected to the splitter circuit, and l second antenna elements 8b connected to the splitter circuit, where n and l are each an integer of 2 or more. The first and second antenna elements 8a and 8b, which radiate signals, need not be disposed so as have different radiation directivities like the antenna elements 8 according to Embodiment 1. The antenna 100f including four first antenna elements 8a and four second antenna elements 8b will be described below.

The splitter circuit includes an input terminal 1 receiving signals; a branch circuit module 2 connected to the input terminal 1; a branch circuit module 3f connected to the branch circuit module 2 at one end; a branch circuit module 4e connected to the branch circuit module 2 at one end; four first switching circuits 5q-5t each connected to the branch circuit module 3f at one end; and four first output terminals 7a that are connected between the four first switching circuits 5q-5t and the four first antenna elements 8a and transmit signals to the input terminal 1; four second switching circuits 5u-5x each connected to the branch circuit module 4e at one end; and four second output terminals 7b that are connected between the four second switching circuits 5u-5x and the four second antenna elements 8b and transmit signals to the input terminal 1. Eight switching circuits 5q-5x are SPDT switches. The switching circuits 5q-5x may be mechanical switches or electronic switches.

The branch circuit module 2 includes a first line 14 having a first end connected to the input terminal 1. The branch circuit module 2 also includes a branch point 22 at a second end of the first line 14. Hereinafter, the characteristic impedance of the first line 14 is denoted by $Z_1$. The length of the first line 14 is denoted by $L_1$. The first line 14 has a characteristic impedance of 25Ω.

The branch circuit module 3f includes the second line 10b having a first end connected to the branch point 22 at the second end of the first line 14; and four fourth lines 12e having first ends connected in parallel to the branch point 20 at the second end of the second line 10b and having second ends connected to the first switching circuits 5q-5t. Hereinafter, the characteristic impedance of the second line 10b is denoted by $Z_2$. The length of the second line 10b is denoted by L. The characteristic impedance of each of the fourth lines 12e is denoted by $Z_4$. The second line 10b has a characteristic impedance of 50Ω.

The branch circuit module 4e includes a third line 11 having a first end connected to the second end of the second line 10b connected to the first line 14 at the branch point 22 and transmitting a signal with a delay time different from that of the second line 10b; and four fifth lines 13b having first ends connected in parallel to the branch point 21 at the second end of the third line 11 and having second ends connected to the second switching circuits 5u-5x. Hereinafter, the characteristic impedance of the third line 11 is denoted by $Z_3$. The length of the third line 11 is denoted by Ld. The characteristic impedance of each of the four fifth lines 13b is denoted by $Z_5$. The third line 11 has a characteristic impedance of 50Ω. In a case where the second line 10b and the third line 11 have the same transmission rate of signals per unit length, the length Ld of the third line 11 is larger than that of the second line 10b.

The first switching circuits 5q-5t have the same configuration. The first switching circuits 5q-5t are each disposed between the second end of the fourth line 12e and the four first output terminal 7a. The first switching circuits 5q-5t connect or disconnect the second ends of the four fourth lines 12e to/from the four first output terminals 7a, respectively. In detail, the first switching circuits 5q-5t each include a switch terminal 51 for connection to the fourth line 12e, a switch terminal 52 for connection to the ground terminal 6, and a switch terminal 53a for connection to the first output terminal 7a. Thereby, the switch terminal 51 is connected to the switch terminal 52, or the switch terminal 51 is connected to the switch terminal 53a. The state of the first switching circuits 5q-5t connecting the switch terminals 51 to the switch terminals 52 will be referred to as an OFF state. The state of the first switching circuits 5q-5t connecting the switch terminals 51 to the switch terminals 53a will be referred to as an ON state. The first switching circuits 5q-5t respectively include control circuits that control the first switching circuits 5q-5t, which are switched to on-states or off-states by the control circuits.

The second switching circuits 5u-5x have the same configuration as the first switching circuits 5q-5t. The second switching circuits 5u-5x are disposed between the second ends of the four fifth lines 13b and the four second output terminals 7b, not between the second ends of the four fourth lines 12e and the four first output terminals 7a. The second switching circuits 5u-5x include switch terminals 53b for connection to the second output terminals 7b instead of the switch terminals 53a for connection to the first output terminals 7a. For the rest, the second switching circuits 5u-5x have the same configuration as the first switching circuits 5q-5t and operate in the same manner.

If any of the first switching circuits 5q-5t is switched to off-states, the switch terminal 52 is connected to the ground terminal 6 and is thus short-circuited. Hence, each fourth line 12e has a length of an odd integral multiple of ¼ of the guide-wavelength in the four fourth lines 12e at an operating frequency to reduce the impedance mismatch among the lines. In a case where each fourth line 12e has a length of an odd integral multiple of ¼ of the wavelength in the four fourth lines 12e at the operating frequency, the switch terminal 52 of the first switching circuit switched to an off-state is open at infinite impedance as seen from the branch point 20. Let the guide-wavelength in the four fourth lines 12e at the operating frequency be $\lambda_1$, then the length of each fourth line 12e is $\lambda_1/4$.

Likewise, when any of the second switching circuits 5u-5x is switched to an off-state, the switch terminal 52 is connected to the ground terminal 6 and is thus short-circuited. Let the guide-wavelength in the four fifth lines 13b at the operating frequency be $\lambda_2$, then the length of each fifth line 13b is $\lambda_2/4$, so that the switch terminal 52 of the second switching circuit switched to an off-state is open at infinite impedance as seen from the branch point 21.

The operation of the antenna 100f will now be described.

When the input terminal 1 receives signals, the signals propagates from the input terminal 1 via the first line 14 to the branch circuit module 2. The signals reaching the branch circuit module 2 are split in two segments at the branch point 22 in the branch circuit module 2 and propagate to the second line 10b and the third line 11. The second line 10b transmits the signals to the branch circuit module 3f. The signals reaching the branch circuit module 3f are split in four segments at the branch point 20 in the branch circuit module 3f and propagate to the fourth lines 12e. The four fourth lines 12e transmit the signals to the first switching circuits 5q-5t. Meanwhile, the third line 11 also transmits the signals to the branch circuit module 4e. The signals reaching the branch circuit module 4e are split in four segments at the branch point 21 in the branch circuit module 4e and propagate to the fifth lines 13b. The four fifth lines 13b transmit the signals to the second switching circuits 5u-5x.

Among the first switching circuits 5q-5t, m arbitrarily selected first switching circuits are switched to on-states. A possible range of m will be described below. In Embodiment 5, two first switching circuits 5r and 5t are switched to on-states whereas the remaining two first switching circuits 5q and 5s are switched to off-states.

Likewise, x second switching circuits arbitrarily selected from the second switching circuits 5u-5x are switched to on-states. A possible range of x will be described below. In Embodiment 5, two second switching circuits 5v and 5x are switched to on-states whereas the remaining two second switching circuits 5u and the 5w are switched to off-states.

The impedance as seen from the first output terminal 7a toward the first output terminal 7a is hereinafter denoted by $Z_e$. The impedance matching before and after the split of signals at the branch point 20 will be discussed where n first antenna elements 8a are provided, m first switching circuits are arbitrarily switched to on-states, the characteristic impedance of the second line 10b is denoted by $Z_2$, and the characteristic impedance of the fourth line 12e is denoted by $Z_4$. It should be noted that the number n of first antenna elements 8a is an integer of 2 or more. The number m of first switching circuits arbitrarily switched to on-states ranges from 1 to n−1. In a case where the length of each fourth line 12e is an odd integral multiple of ¼ of the guide-wavelength in the fourth lines 12e at an operating frequency, the terminals of the first switching circuits switched to off-states are open at infinite impedance as seen from the branch point 20. The terminals of the m first switching circuits switched to on-states are connected in parallel to the lines having the characteristic impedance $Z_4$. Thus, the impedance $Z_e$ as seen from the branch point 20 toward the output terminal 7 is expressed by Expression (4):

[Expression 4]

$$Z_e = \frac{Z_4}{m} \quad (4)$$

Meanwhile, the second line 10b has a characteristic impedance $Z_2$, which is the impedance as seen from the branch point 20 toward the input terminal 1. In order to reduce the signal loss, $Z_e$ should be equal to $Z_2$ for impedance matching before and after the split of signals at the branch point 20. Thus, impedance mismatching does not occur if the characteristic impedance $Z_4$ of each fourth line 12e is equal to $mZ_2$ that is a product between the characteristic impedance of the second line 10b and the number m of the first switching circuits switched to on-states. Arbitrary selection of the m first switching circuits to be switched to on-states in the branch circuit modules 3f does not affect the impedance $Z_e$ as seen from the branch point 20 toward the first output terminal 7a, and thus the impedance mismatch loss does not occur. In the following description, the characteristic impedance of each fourth line 12e is denoted by $mZ_2$.

Likewise, the impedance as seen from the branch point 21 in the branch circuit module 4e toward the second output terminal 7b is denoted by $Z_f$. The impedance matching before and after the split of signals at the branch point 21 will be discussed, where l second antenna elements 8b are provided, x second switching circuits are arbitrarily switched to on-states, the characteristic impedance of the third line 11 is denoted by $Z_3$, and the characteristic impedance of each fifth line 13b is denoted by $Z_5$. It should be noted that the number l of second antenna elements 8b is an integer of 2 or more. The number x of second switching circuits to be arbitrarily switched to on-states is an integer ranging from 1 to (l−1). In a case where the fifth lines 13b each have a length of an odd integral multiple of ¼ of the guide-wavelength in the fifth lines 13b at an operating frequency, the terminals of the second switching circuits switched to off-states are open at infinite impedance as seen from the branch point 21. The terminals of the x second switching circuits switched to on-states are connected to the lines having the characteristic impedance $Z_5$. Thus, the impedance $Z_f$ as seen from the branch point 21 toward the output terminal 7 is expressed by Expression (5):

[Expression 5]

$$Z_f = \frac{Z_5}{x} \quad (5)$$

Meanwhile, the third line 11 has a characteristic impedance $Z_3$, which is the impedance as seen from the branch point 21 toward the input terminal 1. In order to reduce the signal loss, $Z_f$ should be equal to $Z_3$ for impedance matching before and after the split of signals at the branch point 21. Thus, the impedance mismatching does not occur if the characteristic impedance $Z_5$ of each fifth line 13b is equal to $xZ_3$ that is a product between the characteristic impedance of the third line 11 and the number x of the second switching circuits switched to on-states. Arbitrary selection of the x second switching circuits to be switched to on-states in the branch circuit module 4e does not affect the impedance $Z_f$ as seen from the branch point 21 toward the second output terminal 7b, and thus the mismatch loss does not occur. In the following description, the characteristic impedance of each fifth line 13b is denoted by $xZ_3$.

The characteristic impedance of each of the fourth and fifth lines 12e and 13b will now be described in detail. In Embodiment 5, four first antenna element 8a and four second antenna element 8b are provided. Two first switching circuits 5r and 5t among the four first switching circuits 5q-5t are arbitrarily switched to on-states. The two second switching circuits 5v and 5x among the four second switching circuits 5u-5x are arbitrarily switched to on-states. The second line 10b has a characteristic impedance of 50Ω. The third line 11 has a characteristic impedance of 50Ω. The four fourth lines 12e each have a length of $\lambda_1/4$. The four fifth lines 13b each have a length of $\lambda_2/4$.

The switch terminals 52 of the first switching circuits 5q and 5s switched to off-states are open at infinite impedance as seen from the branch point 20. Likewise, the two switch terminals 52 of the second switching circuits 5u and 5w switched to off-states are open at infinite impedance as seen from the branch point 21. The switch terminals 53a of the first switching circuits 5r and 5t switched to on-states are connected in parallel. The switch terminals 53b of the second switching circuits 5v and 5x switched to on-states are connected in parallel. The impedance mismatching does not occur if the characteristic impedance $Z_4$ of each fourth line 12e under the condition described above is the product "100Ω" between the characteristic impedance "50Ω" of the second line 10b and the number "2" of first switching circuits switched to on-states. The impedance mismatching does not occur if the characteristic impedance $Z_5$ of each fifth line 13b under the condition described above is the product "100Ω" between the characteristic impedance "50Ω" of the third line 11 and the number "2" of second switching circuits switched to on-states.

The operation of the antenna 100f will be explained again. When the two first switching circuits 5r and 5t are switched to on-states and the remaining two first switching circuits 5q and 5s are switched to off-states, the first switching circuits 5q and 5s are connected to the ground terminals 6. Since the two first switching circuits 5r and 5t are connected to the first output terminals 7a, signals are transmitted to the first output terminals 7a. The two first antenna element 8a can vary the directivities of the signals from the first output terminals 7a and radiate the signals.

Likewise, when the two second switching circuits 5v and 5x are switched to on-states and the remaining two second switching circuits 5u and 5w are switched to off-states, the second switching circuits 5u and 5w are connected to the ground terminals 6. Since the two second switching circuits 5v and 5x are connected to the second output terminals 7b, signals are transmitted to the second output terminals 7b. Two second antenna elements 8b can vary the directivities of the signals from the second output terminals 7b and radiate the signals. The third line 11 transmits a signal with a delay time different from that of the second line 10b. Thus the signals through the fifth lines 13b are delayed compared to the signals through the fourth lines 12e; hence, the two first antenna elements 8a and the two second antenna elements 8b among the four first antenna elements 8a and the four second antenna elements 8b can vary the directivities of signals from the first output terminals 7a or the second output terminals 7b and radiate the signals.

As described above, in the splitter circuit of the antenna 100f according to Embodiment 5, one to three first switching circuits arbitrarily selected from the first switching circuits 5q-5t are switched to on-states, and one to three second switching circuits arbitrarily selected from the second switching circuits 5u-5x are switched to on-states. The characteristic impedance of the fourth line 12e is the product $mZ_2$ of the characteristic impedance $Z_2$ of the second line 10b and the number m of the first switching circuits switched to on-states. The characteristic impedance of the fifth line 13b is the product $xZ_3$ of the characteristic impedance $Z_3$ of the third line 11 and the x second switching circuits switched to on-states. In such a configuration, signals can be transmitted from the splitter circuit while the directivities of the antenna elements can be varied and the signal loss in the switching circuit can be reduced, because only one switching component is disposed for each first antenna element 8a or second antenna element 8b.

The splitter circuit and antenna 100f according to Embodiment 5 requires only one switching circuit for each first antenna element 8a or second antenna element 8b whereas a splitter circuit in a conventional antenna requires two switching circuits for each antenna element at one end of the branched line. In the splitter circuit in the antenna 100f according to Embodiment 5, the fourth line 12e and the fifth line 13b are connected in parallel to the second line 10b or the third line 11. Thus, the lines transmitting signals have short lengths from the input to the first antenna element 8a or the second antenna element 8b radiating signals compared to lines connected by, for example, a conventional tree connection scheme. In general, as the line length increases, the signal loss and the scale of the circuit increase. Thus, the antenna 100f and splitter circuit according to Embodiment 5 can reduce the signal loss and decrease the size of the circuit, compared to an antenna and conventional splitter circuit provided with conventional switching circuits and lines.

In the splitter circuit of the antenna 100f according to Embodiment 5, the third line 11 transmits a signal with a delay time different from that of the second line 10b. Thus the signals through the fifth lines 13b are delayed compared to the signals through the fourth lines 12e; hence, even if the antenna elements do not have different directivities of signals, the first antenna elements 8a and the second antenna elements 8b can vary the directivities of the signals from the first output terminals 7a or the second output terminals 7b and radiate the signals. It should be noted that the delay time can be arbitrarily determined by the length of the delay line.

In the antenna 100f including the splitter circuit according to Embodiment 5, each fourth line 12e has a length of an odd integral multiple of ¼ of the guide-wavelength in the fourth lines 12e at the operating frequency. Each fifth line 13b has a length of an odd integral multiple of ¼ of the guide-wavelength in the fifth lines 13b at the operating frequency. Thus, the terminals of the first switching circuits or the second switching circuits switched to off-states are open at infinite impedance as seen from the branch point 20 or the branch point 21, and the signal loss can be reduced. It should be noted that the length of the fourth line 12e or the fifth line 13b may be calculated such that the terminal of the first switching circuit or the second switching circuit switched to off-states are open as seen from the branch point 20 or the branch point 21.

In the antenna 100f including the splitter circuit according to Embodiment 5, arbitrary selection of the m first switching circuits and the x second switching circuits to be switched to on-states does not affect the impedance $Z_e$ or the impedance $Z_f$ as seen from the branch point 20 or the branch point 21 toward the output terminals 7; hence, impedance mismatch loss does not occur. Thus, the directivity can be readily varied.

In the antenna 100f including the splitter circuit according to Embodiment 5, the branch circuit module 2, the branch circuit module 3f, and the branch circuit module 4e may include tri-plate strip lines like Embodiment 1. Alternatively, the branch circuit module 2, the branch circuit module 3f, and the branch circuit module 4e may include combinations of strip lines with coaxial lines.

In the antenna 100f and splitter circuit according to Embodiment 5, four first antenna elements 8a and four second antenna elements 8b are provided. Signals from the input terminal 1 are split into two segments in the branch circuit module 2, split into four segments in the branch circuit module 3f, and split into four segments in the branch circuit module 4e. In the description, two first switching circuits 5r and 5t are switched to on-states and two second switching circuits 5v and 5x are switched to on-states. Alternatively, the number n of first antenna elements 8a may be an integer of 2 or more, and the number 1 of second antenna elements 8b may be an integer of 2 or more. The signals from the input terminal 1 may be split into any number of segments in the branch circuit module 2, the branch circuit module 3f, and the branch circuit module 4e. It should be noted, however, that the same number of branch circuit modules as that of split segments in the branch circuit module 2 is required so that signals are transmitted to the first antenna elements 8a and the second antenna elements 8b and are radiated through respective branch circuit modules having different delay times. Equal numbers of branch circuit modules 3f and branch circuit modules 4e have been described. Alternatively, different numbers of branch circuit modules 3f and branch circuit modules 4e may be provided. Furthermore, any number of first switching circuits and second switching circuits to be switched to on-states or off-states may be arbitrarily selected. The number m of first switching circuits to be arbitrarily switched to on-states may be an integer ranging from 1 to n−1, and the number x of second switching circuits to be arbitrarily switched to on-states may be any integer ranging from 1 to (l−1).

In the splitter circuit of the antenna 100f according to Embodiment 5, the first switching circuits 5q-5t and the second switching circuits 5u-5x are provided. The first switching circuits 5q-5t and the second switching circuits 5u-5x have been described that each include a switch terminal 54, a switch terminal 53a or a switch terminal 53b, and a switch terminal 56. Alternatively, the first switching circuits 5q-5t and the second switching circuits 5u-5x may include any number of switch terminals not less than 2.

In the splitter circuit of the antenna 100f according to Embodiment 5, the switch terminals 52 of the first switching circuits 5q-5t and the second switching circuits 5u-5x are connected to the ground terminals 6. In order to reduce the impedance mismatch among the lines, each fourth line 12e has a length of an odd integral multiple of ¼ of the guide-wavelength in the four fourth lines 12e at the operating frequency. Each fifth line 13b has a length of an odd integral multiple of ¼ of the guide-wavelength in the four fifth lines 13b at the operating frequency. Alternatively, the switch terminals 52 of the first switching circuits 5q-5t and the second switching circuits 5u-5x may be connected to open terminals. Each fourth line 12e may have a length of an integral multiple of ½ of the guide-wavelength in the four fourth lines 12e at the operating frequency. Each fifth line 13b may have a length of an integral multiple of ½ of the guide-wavelength in the four fifth lines 13b at the operating frequency.

In the splitter circuit and antenna 100f according to Embodiment 5, the first switching circuits 5q-5t and the second switching circuits 5u-5x are switched to on-states or off-states. Instead of the first switching circuits 5q-5t and the second switching circuits 5u-5x, diode switches may be employed and switched to on-states or off-states.

The splitter circuit and the antenna described in the above embodiments are mere examples and may include any combination of the embodiments in addition to the embodiments alone.

REFERENCE SIGNS LIST

1: input terminal; 2: branch circuit module; 3a to 3f: branch circuit modules; 4a-4e: branch circuit module including delay line; 5a to 5h and 5m to 5x: switching circuits; 5i to 5l: diode switch; 6: ground terminal; 7, 7a, 7b: output terminal; 8, 8a, 8b antenna element; 9 open terminal; 10a first line; 10b second line; 11 delay line; 12a to 12c second line; 12d to 12e fourth line; 13a, 13b fifth line; 14 first line; and 100a to 100f antenna.

The invention claimed is:

1. A splitter circuit comprising:
an input terminal configured to receive a signal;
n output terminals connected to n respective antenna elements which have different transmission directions where n is an integer of 2 or more, and configured to output signals input from the input terminal;
a first line having a first end connected to the input terminal;
n second lines having respective first ends connected in parallel to a second end of the first line; and
n switching circuits connected to respective second ends of the n second lines and the respective n output terminals, and configured to perform switching to connect or disconnect the second ends of the n second lines to/from the n output terminals, wherein
when m switching circuits are arbitrarily selected from among the n switching circuits and switched to on-states where m is an integer ranging from 1 to n−1, characteristic impedances of the n second lines are set to a product between a characteristic impedance of the first line and the integer m denoting a number of the switching circuits switched to on-states, and
the switching circuits include switch terminals to switch and connect the second lines to open terminals.

2. The splitter circuit according to claim 1, wherein the n second lines have lengths, each length being an integral multiple of ½ of a guide-wavelength at an operating frequency of the n second lines.

3. A splitter circuit comprising:
an input terminal configured to receive a signal;
n output terminals connected to n respective antenna elements where n is an integer of 2 or more, and configured to output signals input from the input terminal;
a first line having a first end connected to the input terminal;
a second line having a first end connected to a second end of the first line;
a third line having a first end which is connected to the second end of the first line in parallel with the second line, and configured to transmit a signal with a delay time different from a delay time in the second line;
n fourth lines having first ends connected in parallel to a second end of the second line;
n fifth lines having first ends connected in parallel to a second end of the third line; and
n switching circuits connected to respective second ends of the n fourth lines, respective second ends of the n fifth lines, and the respective n output terminals, and configured to perform switching to connect the n output terminals to either the second ends of the fourth lines or the second ends of the fifth lines, wherein
when m switching circuits are arbitrarily selected from among the n switching circuits and switched to connect with the second ends of the fourth lines where m is an integer ranging from 1 to n−1 while n-m switching circuits are switched to connect with the second ends of the fifth lines, characteristic impedances of the n fourth lines are set to a product between a characteristic impedance of the second line and the integer m denoting a number of the fourth lines connected to the output terminal, and characteristic impedances of the n fifth lines are set to a product between a characteristic impedance of the third line and the integer n-m denoting a number of the fifth lines connected to the output terminal.

4. The splitter circuit according to claim 3, wherein:
the n fourth lines have lengths, each length being an integral multiple of ½ of a guide-wavelength at an operating frequency of the n fourth lines; and
the n fifth lines have lengths, each length being an integral multiple of ½ of a guide-wavelength at an operating frequency of the n fifth lines.

5. The splitter circuit according to claim 3, wherein:
the n fourth lines have lengths, each length being an integral multiple of ¼ of a guide-wavelength at an operating frequency of the n fourth lines; and
the n fifth lines have lengths, each length being an integral multiple of ¼ of a guide-wavelength at an operating frequency of the n fifth lines.

6. The splitter circuit according to claim 3, wherein the switching circuits are single-input multiple-output switches.

7. A splitter circuit comprising:
an input terminal configured to receive a signal;
n first output terminals connected to respective n first antenna elements where n is an integer of 2 or more, and configured to output signals input from the input terminal;
l second output terminals connected to respective l second antenna elements where l is an integer of 2 or more, and configured to output signals input from the input terminal;
a first line having a first end connected to the input terminal;
a second line and a third line which have first ends connected in parallel to a second end of the first line, and configured to transmit signals with different delay times, respectively;
n fourth lines having respective first ends connected in parallel to a second end of the second line;
l fifth lines having respective first ends connected in parallel to a second end of the third line;
n first switching circuits connected to respective second ends of the n fourth lines and the respective n first output terminals, and configured to perform switching to connect or disconnect the second ends of the n fourth lines to/from the n first output terminals; and
l second switching circuits connected to respective second ends of the l fifth lines and the respective l second output terminals, and configured to perform switching to connect or disconnect the second ends of the l fifth lines to/from the l second output terminals, wherein
when m first switching circuits are arbitrarily selected from among the n first switching circuits and switched to on-states where m is an integer ranging from 1 to n−1 while x second switching circuits are arbitrarily selected from among the l second switching circuits and switched to on-states where x is an integer ranging from 1 to l−1, characteristic impedances of the n fourth lines are set to a product between a characteristic impedance of the second line and the integer m denoting a number of the first switching circuits switched to on-states, and characteristic impedances of the l fifth lines are set to a product between a characteristic impedance of the third line and the integer x denoting a number of the second switching circuits switched to on-states.

8. The splitter circuit according to claim 3, wherein the switching circuits are diode switches.

9. The splitter circuit according to claim 1, wherein the switching circuits are single-pole double-throw switches.

10. The splitter circuit according to claim 1, wherein the first line and the second line are strip lines.

11. The splitter circuit according to claim 3, wherein the second line, the third line, the fourth lines, and the fifth lines are strip lines.

12. A splitter circuit comprising;
an input terminal configured to receive a signal;
n output terminals connected to n respective antenna elements which have different transmission directions where n is an integer of 2 or more, and configured to output signals input from the input terminal;
a first line having a first end connected to the input terminal;
n second lines having respective first ends connected in parallel to a second end of the first line; and
n switching circuits connected to respective second ends of the n second lines and the respective n output terminals, and configured to perform switching to connect or disconnect the second ends of the n second lines to/from the n output terminals, wherein
when m switching circuits are arbitrarily selected from among the n switching circuits and switched to on-states where m is an integer ranging from 1 to n−1, characteristic impedances of the n second lines are set to a product between a characteristic impedance of the first line and the integer m denoting a number of the switching circuits switched to on-states, and
the first line is a coaxial line, and the second line is a strip line.

13. The splitter circuit according to claim 3, wherein the second line and the third line are coaxial lines, and the fourth line and the fifth line are strip lines.

14. An antenna comprising:
the splitter circuit according to claim 1; and
n antenna elements connected to the n output terminals, respectively.

15. An antenna comprising:
the splitter circuit according to claim 7;
n first antenna elements connected to the n first output terminals, respectively; and
l second antenna elements connected to the l second output terminals, respectively.

16. An antenna comprising:
the splitter circuit according to claim 3; and
n antenna elements connected to the n output terminals, respectively.

17. An antenna comprising:
the splitter circuit according to claim 12; and
n antenna elements connected to the n output terminals, respectively.

* * * * *